US006950451B2

(12) United States Patent
Tojo et al.

(10) Patent No.: US 6,950,451 B2
(45) Date of Patent: Sep. 27, 2005

(54) MULTI-BEAM SEMICONDUCTOR LASER ELEMENT

(75) Inventors: Tsuyoshi Tojo, Miyagai (JP); Tomonori Hino, Kanagawa (JP); Osamu Goto, Miyagi (JP); Yoshifumi Yabuki, Miyagi (JP); Shinichi Ansai, Miyagi (JP); Shiro Uchida, Miyagi (JP); Masao Ikeda, Miyagi (JP)

(73) Assignee: Sony Corporation, Tokyo (JP)

( * ) Notice: Subject to any disclaimer, the term of this patent is extended or adjusted under 35 U.S.C. 154(b) by 45 days.

(21) Appl. No.: 10/480,568

(22) PCT Filed: Jun. 14, 2002

(86) PCT No.: PCT/JP02/05967

§ 371 (c)(1),
(2), (4) Date: Dec. 12, 2003

(87) PCT Pub. No.: WO02/103868

PCT Pub. Date: Dec. 27, 2002

(65) Prior Publication Data

US 2004/0170203 A1 Sep. 2, 2004

(30) Foreign Application Priority Data

Jun. 15, 2001 (JP) ........................................ 2001-182305
Jun. 15, 2001 (JP) ........................................ 2001-182306

(51) Int. Cl.[7] ............................ H01S 3/10; H01S 5/00; H01S 3/14; H01S 3/082
(52) U.S. Cl. ............................ 372/23; 372/43; 372/68; 372/97
(58) Field of Search ............................ 372/23, 43, 68, 372/97

(56) References Cited

U.S. PATENT DOCUMENTS 6,031,858 A 2/2000 Hatakoshi

FOREIGN PATENT DOCUMENTS

| EP | 0 852 416 A1 | 7/1998 |
| EP | 1005068 | 8/1999 |
| EP | 1 104 031 A2 | 5/2001 |
| JP | 03-214684 | 9/1991 |
| JP | 11-233893 | 8/1999 |
| JP | 2000-196197 | 7/2000 |
| JP | 2000-277863 | 10/2000 |
| JP | 2001-7743 | 2/2001 |
| JP | 2001-217503 | 8/2001 |
| JP | 2001-257429 | 9/2001 |
| JP | 2002-16321 | 1/2002 |
| JP | 2002-76522 | 3/2002 |

OTHER PUBLICATIONS

Tsuyoshi Tojo, et al., "GaN–based High Power Blue–violet Laser Diodes", Proceedings of International Workshop on Nitride Semiconductors, IPAP Conference Series 1 (2000), pp. 878–882.

*Primary Examiner*—Minsun Oh Harvey
*Assistant Examiner*—Armando Rodriguez
(74) *Attorney, Agent, or Firm*—Sonnenschein, Nath & Rosenthal LLP

(57) ABSTRACT

A multi-beam semiconductor laser device capable of emitting respective laser beams with uniform optical output levels and enabling easy alignment is provided. This multi-beam semiconductor laser device (40) is a GaN base multi-beam semiconductor laser device provided with four laser stripes (42A, 42B, 42C and 42D) which are capable of emitting laser beams with the same wavelength. The respective laser oscillating regions (42A to 42D) are provided with a p-type common electrode (48) on a mesa structure (46) which is formed on a sapphire substrate (44), and have active regions (50A, 50B, 50C and 50D) respectively. Two n-type electrodes (52A and 52B) are provided on an n-type GaN contact layer (54) and located as common electrodes opposite to the p-type common electrode (48) on both sides of the mesa structure (46). The distance A between the laser stripe (42A) and the laser stripe (42D) is no larger than 100 $\mu$m. The distance $B_1$ between the laser stripe (42A) and the n-type electrode (52B) is no larger than 150 $\mu$m while the distance $B_2$ between the laser stripe (42D) and the n-type electrode (52A) is no larger than 150 $\mu$m.

8 Claims, 25 Drawing Sheets

MULTI-BEAM SEMICONDUCTOR LASER ELEMENT

FIELD OF THE INVENTION

The present invention relates to a multi-beam semiconductor laser device which is provided with a plurality of laser oscillating regions in the form of stripes and capable of emitting a laser beam from each laser oscillating region thereof, and in particular relates to a multi-beam semiconductor laser device which is made of a gallium nitride (GaN) III-V group compound semiconductor.

BACKGROUND OF THE INVENTION

Multi-Beam Semiconductor Laser Device

In recent years, there is a demand for the increase in the operation speed and the capacity of an optical disc device, a laser beam printer, a copying machine and the like device making use of a semiconductor laser as a light source. To meet the demand for the increase in the operation speed and the capacity, it has been proposed to utilize a multi-beam semiconductor laser capable of emitting a plurality of laser beams (referred to as multiple beams in the following explanation) as a light source. For example, in the case of an optical disc device, it is possible to increase the read rate thereof by reading data from a plurality of tracks with a plurality of laser beams at the same time by the use of a multi-beam semiconductor laser.

On the other hand, while the optical output level required of the light source of an optical disc device is only several tens of mW at most, a semiconductor laser device can be used in the field of laser processing technologies and in the field of medicine by increasing the optical output level thereof to the order of W. Accordingly, the multi-beam semiconductor laser study is in works to increase the total optical output level of laser light.

Next, with reference to FIG. 10 and FIG. 11, the configuration of a prior art multi-beam semiconductor laser device is explained.

The multi-beam semiconductor laser device 10 as illustrated in FIG. 10 is capable of emitting two laser beams, and composed of two laser oscillating regions 14A and 14B sharing a common substrate 12, and provided with electrodes 16A and 16B respectively on the laser oscillating regions 14A and 14B. An opposite electrode 17 located opposed to the electrodes 16A and 16B is provided on the rear surface of the substrate 12 as a common electrode.

Furthermore, the multi-beam semiconductor laser device 10 is provided with two contact electrodes 18A and 18B to be in contact with the electrodes 16A and 16B respectively, and a base substrate 22 provided with wiring patterns 20A and 20B with which the contact electrodes 18A and 18B are connected to external terminals, wherein the electrodes 16A and 16B are electrically and mechanically connected to the contact electrodes 18A and 18B in the form of an integrated multi-beam semiconductor laser device configuration.

The multi-beam semiconductor laser device 24 as illustrated in FIG. 11 is capable of emitting four laser beams, and composed of four laser oscillating regions 28A, 28B, 28C and 28D sharing a common substrate 26, and provided with electrodes 30A, 30B, 30C and 30D respectively on the laser oscillating regions 28A to 28D. An opposite electrode 31 located opposed to the electrodes 30A to 30D is provided on the rear surface of the substrate 26 as a common electrode. Furthermore, the multi-beam semiconductor laser device 24 is provided with four contact electrodes 32A, 32B, 32C and 32D to be in contact with the electrodes 30A to 30D respectively, and a base substrate 36 provided with wiring patterns 34A, 34B, 34C and 34D with which the contact electrodes 32A to 32D are connected to external terminals, wherein the electrodes 30A to 30D are electrically and mechanically connected to the contact electrodes 32A to 32D in the form of an integrated multi-beam semiconductor laser device configuration.

GaN Base Semiconductor Laser Device Fabricated By Using The ELO Technique

On the other hand, in the field of optical memories, there is a need for a semiconductor laser device capable of emitting short-wavelength light in order to increase the recording density of an optical recording medium such as an optical disc. To meet it, research is actively carried out into gallium nitride (GaN) III-V group compound semiconductors (referred to as GaN base compound semiconductors in the following description).

A GaN base semiconductor laser device is composed generally of a laminate structure grown on a substrate. Since the device characteristics of a GaN base compound semiconductor device are affected by the crystalline condition of a GaN base compound semiconductor layer grown on a substrate, it is required for the purpose of good device characteristics to form the laminate structure of the GaN base compound semiconductor in which a few crystal defects exist.

However, since no appropriate substrate has been found which can provide a good lattice match with a GaN semiconductor as a base substrate on which a GaN base compound semiconductor layer is grown, a sapphire ($\alpha$-$Al_2O_3$) substrate has been used for this purpose while the lattice constants of a sapphire substrate and a GaN layer are different from each other resulting in lattice mismatch, and in addition to this, the coefficients of thermal expansion are largely different from each other.

When a substrate provides only a poor lattice match with a GaN base compound semiconductor layer, there is generated a substantial strain within the GaN base compound semiconductor layer grown on the substrate, and therefore the crystallinity suffers from various adverse effects. For example, in order to lessen the strain as generated, a large amount of dislocations are generated in the GaN base compound semiconductor layer on the sapphire substrate with a density of the order of $10^8 cm^{-2}$ to $10^{10} cm^{-2}$.

The dislocations include threading dislocations which propagate in the thickness direction of the GaN base compound semiconductor layer, reach an active layer formed in the GaN base compound semiconductor layer, and become detrimental crystal defects which function as current leakage paths, non-light-emitting centers, and so forth to deteriorate the electric and optical characteristics of the device. Accordingly, the generation of threading dislocations has to be minimized in order to fabricate a GaN base semiconductor device having good device characteristics. From this view point, in recent years, ELO (Epitaxial Lateral Overgrowth) techniques are developed as an effective technique to lessen the generation of threading dislocations by the use of epitaxial growth in the lateral direction.

The ELO techniques are generally classified into two types, i.e., mask-using ELO techniques and free-standing ELO techniques (referred to as FS-ELO techniques in the following description).

In accordance with an FS-ELO technique, after growing a GaN base layer on a sapphire substrate, a concavo-convex stripe pattern is formed on the GaN base layer by etching the GaN base layer, for example, by reactive ion etching (RIE). The concavo-convex stripe pattern is formed as a concavo-convex structure in the form of stripes including concave areas formed by removing the GaN base layer and the most upper surface portion of the substrate to expose the substrate, and convex portion formed by the GaN base layer on the upper surface of the substrate. Next, in accordance with the technique, a GaN layer is epitaxial grown on the concavo-convex structure in the upper direction while the epitaxial grown GaN layer is further grown in the lateral direction to fill the concave areas. The dislocation density has been evaluated to be low in an area formed by epitaxial growth in the lateral direction (referred to as a wing area in the following explanation).

In the following description, the growth in the lateral direction by the FS-ELO technique will be explained together with the shortcomings thereof in further detail with reference to FIG. 16A to FIG. 16C and FIG. 17A and FIG. 17B.

First, as illustrated in FIG. 16A, a GaN layer 174 is formed on a sapphire substrate 172. Since there are lattice mismatch and thermal mismatch between the sapphire substrate 172 and the GaN layer 174, a high density defective region 176 is formed in the GaN layer 174 adjacent to the substrate as shown in FIG. 16B.

Meanwhile, in the case where a buffer layer of GaN, AlN or the like is formed on the sapphire substrate 172 in advance of forming the GaN layer 174, the high density defective region 176 of the buffer layer is formed in the vicinity of the sapphire substrate 172.

More specifically speaking, the seed defects as generated in the high density defective region 176 include stacking defects, dislocation loops having components extending approximately in parallel to the crystal growth plane, and threading dislocations extending approximately in parallel to the growth direction. Among them, the threading dislocations extending approximately in parallel to the growth direction furthermore extend from the high density defective region 176 into the GaN layer 174.

Next, after forming a mask in the form of stripes (not shown in the figure) on the GaN layer 174, a concavo-convex structure is formed on the surface of the substrate as illustrated in FIG. 16C by etching the GaN layer 174 and the upper portion of the sapphire substrate 172. In the following explanation, the convex portion is referred to as a seed crystal area 178.

Next, after removing the mask formed on the seed crystal areas 178 by chemical etching or the like, a second GaN layer 180 is grown on the upper portion of the seed crystal areas 178, while growing between the seed crystal areas 178 as the wing areas 182 by epitaxially growing the second GaN layer 180 under such a growth condition that it is grown mainly in the lateral direction as illustrated in FIG. 17A. When the wing areas 182 are formed by the second GaN layer 180, a vacant space 184 is formed between the second GaN layer 180 and the sapphire substrate 172.

In this case, crystal defects are generated within the wing areas 182 during the growth in the lateral direction when the second GaN layer 180 is formed. Namely, as illustrated in FIG. 17B, dislocations 186A and 186B are formed from the high density defective region 176 in order to propagate approximately in parallel to the substrate while, among these dislocations, the dislocations 186A are bended at a meeting location 188 and extended in the vertical direction therefrom. Also, the dislocation 186B is bended in the vicinity of the meeting location 188 and extended in the vertical direction. Furthermore, threading dislocations 190 are observed which are extended through the seed crystal area 178 in the thickness direction of the second GaN layer 180 from the high density defective region 176.

As explained in the above, while high density defective region are generated above the seed crystal areas 178 and the intermediate location between adjacent seed crystal areas 178, low density defective regions are regions of the wing areas 182 as located between the meeting location 188 and the respective seed crystal area 178. Accordingly, the high density defective regions and the low density defective regions are periodically located corresponding to the periodical arrangement of the seed crystal areas.

First Object of the Present Invention

On the other hand, there are the following problems of the multi-beam semiconductor laser device in accordance with the conventional technique as illustrated in FIG. 10 and FIG. 11.

The first problem is that it is difficult to apply the configuration of the prior art multi-beam semiconductor laser device to a semiconductor laser device, such as a GaN base semiconductor laser device, which is provided with a p-type electrode and an n-type electrode in the same side of the substrate.

The second problem is that, in the case of a GaN base semiconductor laser device, which is provided with a p-type electrode and an n-type electrode in the same side of the substrate, it is difficult to fabricate a multi-beam semiconductor laser device capable of emitting respective laser beams with uniform optical output levels.

The third problem is that since each electrode on the laser oscillating region is connected to the corresponding contact electrode, it is extremely difficult to align these electrodes with each other in the case where the interval between the respective laser oscillating regions becomes narrow.

In other words, since the interval between the respective laser oscillating regions and the interval between the respective contact areas are small, one contact electrode can be connected to two laser oscillating regions only when the location of the contact electrode is slightly displaced with respect to the electrodes of the laser oscillating regions. As a result, the device yield of the multi-beam semiconductor laser device will drop. Accordingly, it is difficult in practice to increase the optical output level by increasing the number of laser beams.

It is therefore the first object of the present invention to provide a multi-beam semiconductor laser device in which the optical output levels of the respective beams are equal to each other while alignment is easy.

Second Object of the Present Invention

While the multi-beam semiconductor laser study is in works to increase the total optical output level of laser light as described above, the laser characteristics tend to be degraded while the device life cycle is shortened if a laser oscillating region is arranged on a high density defective region where crystal defects are generated due to dislocations when a multi-beam semiconductor laser is fabricated by the ELO method.

However, unless the location of a laser oscillating region has been determinate with respect to high density defective regions and low density defective regions, the attempt to locate a laser oscillating region above a low density defective region ends up in failure. From this fact, it is difficult to fabricate a multi-beam semiconductor laser device having good laser characteristics, a high optical output level and a long device life cycle.

Accordingly, the second object of the present invention is to provide a multi-beam semiconductor laser device having good laser characteristics and a high optical output level.

DISCLOSURE OF THE INVENTION

First Invention for Accomplishing the First Object:

In order to accomplishing the first object as described above, a multi-beam semiconductor laser device in accordance with the present invention (referred to as the first invention in the following description) has a common substrate provided with a mesa structure on which a plurality of laser oscillating regions are fabricated in the form of stripes, and comprises: a first electrode provided for each of the plurality of laser oscillating regions for functioning as one of a p-type electrode and an n-type electrode of each laser oscillating region; and a second electrode located aside of the mesa structure on the common substrate as a common electrode to at least two of the plurality of the laser oscillating regions for functioning as the other of the p-type electrode and the n-type electrode of each of the two laser oscillating regions and as an opposite electrode to the first electrode.

The above described first electrode may be separately provided for each laser oscillating region, or alternatively may be provided as a common electrode to the respective laser oscillating regions.

In the case of the multi-beam semiconductor laser device in accordance with the first invention, it is easy to adjust the alignment of electrodes, when mounting on a sub mount, by designing the p-type electrode as a common electrode and the n-type electrode as a common electrode.

Also, the second electrode may be provided on the both sides of the mesa structure as common opposite electrodes to the above described first electrode, alternatively may be provided between adjacent mesa structures as a common opposite electrode.

Preferably, the following equations are satisfied.

$$A \leq 100 \ \mu m$$

$$B \leq 150 \ \mu m$$

where A is a distance between one of the laser oscillating regions closest to an edge of the common electrode aside of the laser oscillating regions and another of the laser oscillating regions farthest from the edge of the common electrode; and B is a distance between another of the oscillating regions farthest from the edge of the common electrode and the edge of the common electrode aside of the laser oscillating regions.

In this case, the one of the laser oscillating regions closest to the edge of the common electrode and the another of the oscillating regions farthest from the edge of the common electrode for defining A and B are laser oscillating regions which share the same common electrode. For example, in the case where a common electrode is provided on each of the both sides of the plurality of laser oscillating regions, A and B are defined by those of the plurality of the laser oscillating regions that are substantially sharing one common electrode while A and B are furthermore defined by the remainder of the plurality of the laser oscillating regions that are substantially sharing the other common electrode.

The numerical values determining the ranges of the above described A and B have been based on the results of experiments and the result of simulation with either of the above described common electrodes.

For example, if B exceeds 150 $\mu$m when the driving current is 50 mA, the voltage drop between the above described farthest laser oscillating region and the common electrode increases, for example, to exceed 0.05 V and therefore it is difficult to emit respective laser beams from a plurality of laser oscillating regions with uniform optical output levels.

In the case of the multi-beam semiconductor laser device in accordance with the first invention, laser oscillating regions are provided with one electrode of a p-type electrode and an n-type electrode as a first electrode on a mesa structure formed on a common substrate, while a second electrode of the other electrode of the p-type electrode and the n-type electrode is provided aside of the mesa structure as a common electrode opposite to the first electrode, and therefore the optical output levels of the respective laser oscillating regions becomes high and uniform.

The multi-beam semiconductor laser device in accordance with the first invention is applicable irrespective of the composition of a substrate and the composition of a compound semiconductor layer forming a laser structure, for example, is preferably applicable to a GaN base semiconductor laser device.

A GaN base semiconductor laser device is a semiconductor laser device comprising a sapphire substrate or a GaN substrate on which is formed an $Al_aB_bGa_cIn_dN$ (a+b+c+d=1 and $0 \leq a,b,c,d \leq 1$) film as a constituent layer.

When the first invention is applied, there is no restriction on the structure of a light waveguide so that the first invention is applicable to refractive index guided structures and also applicable to gain guided structures. Furthermore, there is no restriction on the structure of a laser oscillating region so that the first invention is applicable to air-ridge types, buried ridge types and so forth.

Still further, there is no restriction on the current confinement structure so that the first invention is applicable to a current confinement structure by the use of an insulating film, a high resistance layer, separation of a PN junction and so forth.

Also, the multi-beam semiconductor laser device in accordance with the first invention is suitable as a device to be mounted on the sub mount in a junction down fashion, and in this case, it is connected to a sub mount which is provided with a first junction electrode to be electrically connected to the above described one electrode and a second junction electrode to be electrically connected to the above described electrode.

Second to Fifth Inventions for Accomplishing the Second Object:

In order to accomplishing the second object, the inventor of the present invention has obtained the results as illustrated in FIG. 18 by investigating the defect density (EPD; Etch Pit Density) of a substrate within which are formed high density defective regions originating from seed crystal areas and meeting locations and low density defective regions each of which is located between adjacent ones of the seed crystal areas and the meeting locations, the high density defective regions and the low density defective regions being periodically and alternately arranged in parallel with each other in the form of stripes.

Namely, the defect density reached $5 \times 10^8$ cm$^{-2}$ in the location over and near a seed crystal area while the defect density reached $1 \times 10^8$ cm$^{-2}$ in a meeting location. However, in the location 0.5 $\mu$m or more distant from the seed crystal area and the meeting location, the defect density failed to $10^5$ cm$^{-2}$, and therefore it was confirmed that the location could be considered as a low density defective region.

Accordingly, it is possible to fabricate a multi-beam semiconductor laser device having good laser characteristics by arranging laser oscillating regions in low density defective regions which are 0.5 $\mu$m or more distant from seed crystal areas and meeting locations.

Also, since a conventional semiconductor laser device with an output level in the order of W has one laser oscillating region from which a laser light is emitted at a high optical output level without causing destruction of the end surface thereof, the width of the laser oscillating region is 50 μm to 100 μm.

In this case, since the maximum interval of seed crystal areas is 18 μm or thereabout, the laser oscillating region is formed over seed crystal areas and meeting locations which are high density defective regions, and therefore the laser characteristics tend to be degraded while the device life cycle is shortened On the other hand, if adjacent seed crystal areas are arranged apart from each other by an interval of 18 μm or wider, a GaN base compound semiconductor layer can not sufficiently be grown in the lateral direction from the seed crystal areas.

Accordingly, the inventor of the present invention come up with the idea that a high reliability semiconductor laser device having good laser characteristics, a high optical output level and a long device life cycle could be realized by providing a plurality of narrow laser oscillating regions located in low density defective regions respectively, and culminated the present invention after repeating various experiments.

Second Invention

In order to accomplishing the second object as described above, taking into consideration the above idea, a multi-beam semiconductor laser device in accordance with the present invention (referred to as the second invention in the following description) has a common substrate within which are formed high density defective regions originating from seed crystal areas and meeting locations and low density defective regions each of which is located between adjacent ones of the seed crystal areas and the meeting locations, the high density defective regions and the low density defective regions being periodically and alternately arranged in parallel with each other in the form of stripes; and a plurality of laser oscillating regions formed on the common substrate and capable of emitting laser beams respectively, wherein each of the laser oscillating regions is located in a different one of the low density defective regions, and wherein $X_1 \geq 0.5$ μm $X_2 \geq 0.5$ μm where $X_1$ is a distance between each of the laser oscillating regions and one of the seed crystal areas, and $X_2$ is a distance between each of the laser oscillating regions and one of the meeting locations.

The limitations of $X_1 \geq 0.5$ μm and $X_2 0.5$ μm of the second invention are based upon the experimental results as described above.

The same is applied to the third to fifth inventions as follows.

Third Invention

Another multi-beam semiconductor laser device in accordance with the present invention (referred to as the third invention in the following description) has a common substrate within which are formed high density defective regions originating from seed crystal areas and meeting locations and low density defective regions each of which is located between adjacent ones of the seed crystal areas and the meeting locations, the high density defective regions and the low density defective regions being periodically and alternately arranged in parallel with each other in the form of stripes; and a plurality of laser oscillating regions formed on the common substrate and capable of emitting laser beams respectively, wherein the laser oscillating regions are located in the low density defective regions which are arranged adjacent to each other with the seed crystal areas and the meeting locations inbetween, and wherein $X_1 \geq 0.5$ μm $X_2 \geq 0.5$ μm where $X_1$ is a distance between one of the laser oscillating regions and one of the seed crystal areas, and $X_2$ is a distance between one of the laser oscillating regions and one of the meeting locations.

In the case of the multi-beam semiconductor laser device in accordance with the third invention, a plurality of laser oscillating regions may be arranged in each low density defective region with a seed crystal area or a meeting location inbetween respectively. Also, the number of laser oscillating regions arranged in one low density defective region may be different than the number of laser oscillating regions in an adjacent low density defective region.

Fourth Invention

A further multi-beam semiconductor laser device in accordance with the present invention (referred to as the fourth invention in the following description) has a common substrate within which are formed high density defective regions originating from seed crystal areas and meeting locations and low density defective regions each of which is located between adjacent ones of the seed crystal areas and the meeting locations, the high density defective regions and the low density defective regions being periodically and alternately arranged in parallel with each other in the form of stripes; and a plurality of laser oscillating regions formed on the common substrate and capable of emitting laser beams respectively, wherein at least two of the laser oscillating regions are located in each of the low density defective regions, and wherein $X_1 \geq 0.5$ μm $X_2 \geq 0.5$ μm where $X_1$ is a distance between one of the laser oscillating regions and one of the seed crystal areas, and $X_2$ is a distance between one of the laser oscillating regions and one of the meeting locations.

Fifth Invention

A still further multi-beam semiconductor laser device in accordance with the present invention (referred to as the fifth invention in the following description) has a common substrate within which are formed high density defective regions originating from seed crystal areas and meeting locations and low density defective regions each of which is located between adjacent ones of the seed crystal areas and the meeting locations, the high density defective regions and the low density defective regions being periodically and alternately arranged in parallel with each other in the form of stripes; and a plurality of laser oscillating regions formed on the common substrate and capable of emitting laser beams respectively, wherein the laser oscillating regions are located on every other region of the low density defective regions, and wherein $X_1 \geq 0.5$ μm $X_2 \geq 0.5$ μm where $X_1$ is a distance between one of the laser oscillating regions and one of the seed crystal areas, and $X_2$ is a distance between one of the laser oscillating regions and one of the meeting locations.

In the case of the multi-beam semiconductor laser devices in accordance with the second to fifth inventions, the respective laser oscillating regions may be capable of emitting laser light of different wavelengths and/or at different output power levels.

Also, in the case of the multi-beam semiconductor laser devices in accordance with the second to fifth inventions, there is no restriction on the fabrication process of a substrate as long as the substrate comprises high density defective regions originating from seed crystal areas and meeting locations and low density defective regions each of which is located between adjacent ones of the seed crystal areas and the meeting locations, the high density defective regions and the low density defective regions being periodically and alternately arranged in parallel with each other in the form of stripes. Furthermore, basically, while there is no restriction on the composition of a GaN base compound semiconductor layer constituting a laser structure, the present invention may be best suited for a GaN base laser structure.

In this case, a GaN base compound semiconductor is represented by $Al_aB_bGa_cIn_dN$ (a+b+c+d=1 and $0 \leq a,b,c,d \leq 1$).

When any of the second to fifth inventions is applied, there is no restriction on the configuration of the waveguide, so that the invention is applicable to refractive index guided structures and also applicable to gain guided structures. Furthermore, there is no restriction on the structure of a laser oscillating region so that the invention is applicable to air-ridge types, buried ridge types and so forth. Also, there is no restriction on the current confinement structure so that the invention is applicable to a current confinement structure by the use of an insulating film, a high resistance layer, separation of a PN junction and so forth.

Third Object of the Present Invention

Meanwhile, when the multi-beam semiconductor laser device in accordance with the first invention was being developed, the following points were realized.

Since nitride base semiconductor laser devices are fabricated, in many cases, on sapphire substrates which are made of an insulating material, an n-type electrode and a p-type electrode are usually formed in the laminate structure of compound semiconductors and located opposite to the sapphire substrate in the form of a resonating structure.

For example, in the case of a nitride base multi-beam semiconductor laser device 250 as illustrated in FIG. 24, a plurality of laser oscillating regions 252A, 252B, 252C and 252D are laterally arranged in parallel on a common mesa structure 253 and provided with electrodes (referred to as stripe electrodes for the sake of clarity in explanation) 254A, 254B, 254C and 254D for the respective laser oscillating regions 252A to 252D and common n-type electrodes 256A and 256B which are formed on an n-type contact layer 257 in the laminate structure opposite to the sapphire substrate 258.

Then, the distances from the respective stripe electrodes 254A to 254D to the common n-type electrode 256A or 256B are different from each other. For this reason, the remoter the laser oscillating region is located from the common n-type electrode 256A or 256B, the longer the current path between the n-type electrode and the p-type electrode become, resulting in a higher electric resistance.

As a result, the amounts of current as injected to the respective stripe electrodes 254A to 254D are different from each other laser oscillating region so that the remoter the laser oscillating region is located from the n-type electrode, the weaker the luminescence intensity of light emitted from the laser oscillating region as illustrated in FIG. 25.

In this manner, in the case of a multi-beam semiconductor laser device having dispersed luminescence intensities of laser oscillating regions, the laser oscillating region capable of emitting a higher intensity beam tends to quickly deteriorate and therefore the device life cycle of the multi-beam semiconductor laser device is shorter than that of a multi-beam semiconductor laser device capable of emitting uniform laser beams.

Sixth Invention for Accomplishing the Third Object:

It is therefore the third object of the present invention to provide a multi-beam semiconductor laser device in which the luminescence intensities of the respective beams are uniform.

In order to accomplishing the third object as described above, a multi-beam semiconductor laser device in accordance with the present invention (referred to as the sixth invention in the following description) has a common substrate provided with a mesa structure on which a plurality of laser oscillating regions are fabricated in the form of stripes, the multi-beam semiconductor laser device comprising: a first electrode (stripe electrodes) provided for each of the plurality of laser oscillating regions for functioning as one of a p-type electrode and an n-type electrode of the laser oscillating region; and a second electrode located aside of the mesa structure on the common substrate as a common electrode to at least two of the plurality of the laser oscillating regions for functioning as the other of the p-type electrode and the n-type electrode of each of the two laser oscillating regions and as an opposite electrode to the first electrode, wherein the plurality of the stripe electrodes of the first electrode have different areas corresponding to the distances thereof from the common electrode in order to flow a substantially same current from the stripe electrodes of the first electrode.

In the case of the multi-beam semiconductor laser device in accordance with the sixth invention, the luminescence intensities of the respective location of the laser oscillating regions are made uniform by changing the areas of the first electrodes in accordance with the distance therefrom to the common electrode in order to make equal the respective electric resistances between the respective first electrodes and the common electrode and to flow the same current between the respective first electrodes and the common electrode.

In the case of a specific embodiment of the sixth invention wherein n laser oscillating regions are provided with a first electrode in the form of stripe electrodes respectively and joined to a common electrode located aside of a mesa structure, the following equation is satisfied $$(\rho v \cdot d)/S(i) + rsh \cdot (l(i)/L) = C \text{ (constant value)} \quad \text{(Equation 1)}$$

where ρv is an effective specific resistance in the longitudinal direction from the first electrode through the active layer; d is an effective thickness in the longitudinal direction from the first electrode to the common electrode through the active layer; rsh is a sheet resistance from the first electrode to the common electrode; L is a resonator length of the laser oscillating regions; S(i) is the area of the first electrode of i-th (i=1, 2, . . . n) laser oscillating region (i) of the laser oscillating regions; l(i) is a distance in the lateral direction from the center of the laser oscillating region (i) to the common electrode.

In the case of a specific embodiment of the sixth invention wherein n laser oscillating regions are provided with the first electrode in the form of stripe electrodes respectively and joined to first and second common electrodes located on both sides of a mesa structure, the following equation is satisfied $$(\rho v \cdot d)/S(i) + rsh \cdot A(i) \cdot (1/L) = C \text{ (constant value)}$$

$$A(i) = (lN(i) \cdot lF(i))/(lN(i) + lF(i)) \quad \text{(Equation 2)}$$

where ρv is an effective specific resistance in the longitudinal direction from the first electrode through the active layer; d is an effective thickness in the longitudinal direction from the first electrode to the first and equivalently second common electrode through the active layer; rsh is a sheet resistance from the first electrode to the first and equivalently second common electrode; L is a resonator length of the laser oscillating regions; S(i) is the area of the stripe electrode of the first electrode of i-th (i=1, 2, . . . n) laser oscillating region (i) of the laser oscillating regions; lN(i) is a distance in the lateral direction from the center of the laser oscillating region (i) to one of the common electrode near to the center of the laser oscillating region (i); lF(i) is a distance in the lateral direction from the center of the laser oscillating region (i) to one of the common electrode remote from the center of the laser oscillating region (i).

In the case of the two examples as described above of the embodiment of the sixth invention, it is possible to make equal the respective electric resistances between the respective first electrodes and the common electrode and to flow the same current between the respective first electrodes and the common electrode by designing the areas S(i) of the first electrode as described above. Alternatively, the product W(i)·L of the width W(i) of the first electrode of the laser oscillating region (i) and the resonator length L of the laser oscillating region (i) may be changed for the same purpose as the area S(i).

In the case of the multi-beam semiconductor laser device in accordance with the sixth invention wherein the laser oscillating region thereof has the constant width in the longitudinal direction, the invention is not limited thereto but also applicable to the case where at least one edge of at least one of a plurality of laser oscillating regions is tapered in a plan view.

The effective thickness d in the longitudinal direction from the first electrode to the common electrode through the active layer and the effective thickness d in the longitudinal direction from the first electrode to the first and second common electrodes through the active layer can be recognized as the height of the common mesa structure.

BRIEF DESCRIPTION OF DRAWINGS

FIG. 17A is a cross sectional view explaining the step of the growth technique in the lateral direction by the FS-ELO technique following FIG. 16C while

DETAILED DESCRIPTION OF THE PREFERRED EMBODIMENTS

In the followings, various embodiments of the present invention will be specifically and detailedly described with reference to the accompanying drawings. Meanwhile, the film formation process, the compositions and the film thicknesses of compound semiconductor layers, the ridge widths, the process conditions and so forth as described in the explanation of the following embodiments are merely illustrative instead of limiting on the present invention.

First Embodiment of the First Invention

Figure 1:
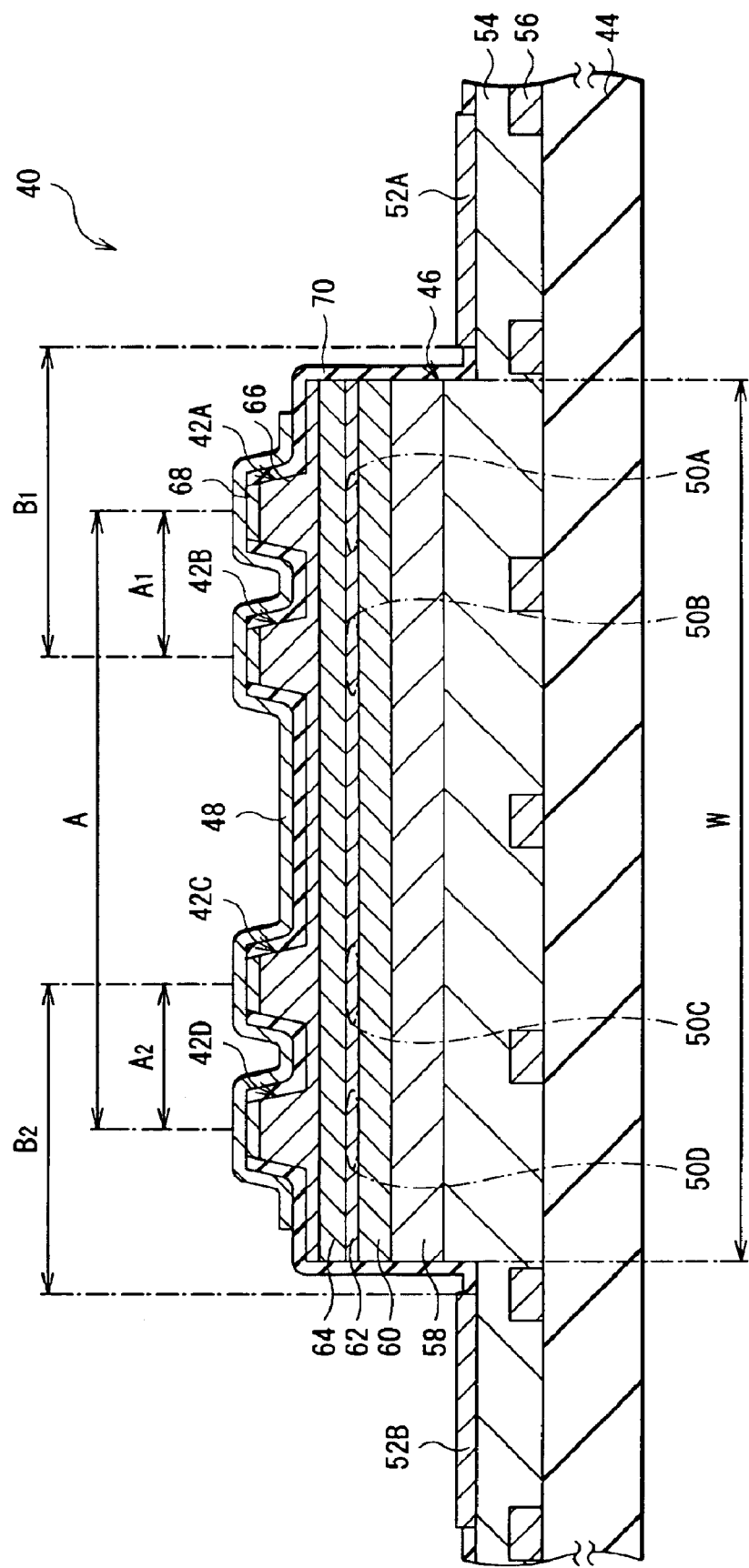
FIG. 1 is a schematic cross section view showing the overall configuration of the multi-beam semiconductor laser device in accordance with a first embodiment of a first invention.
Figure 2:
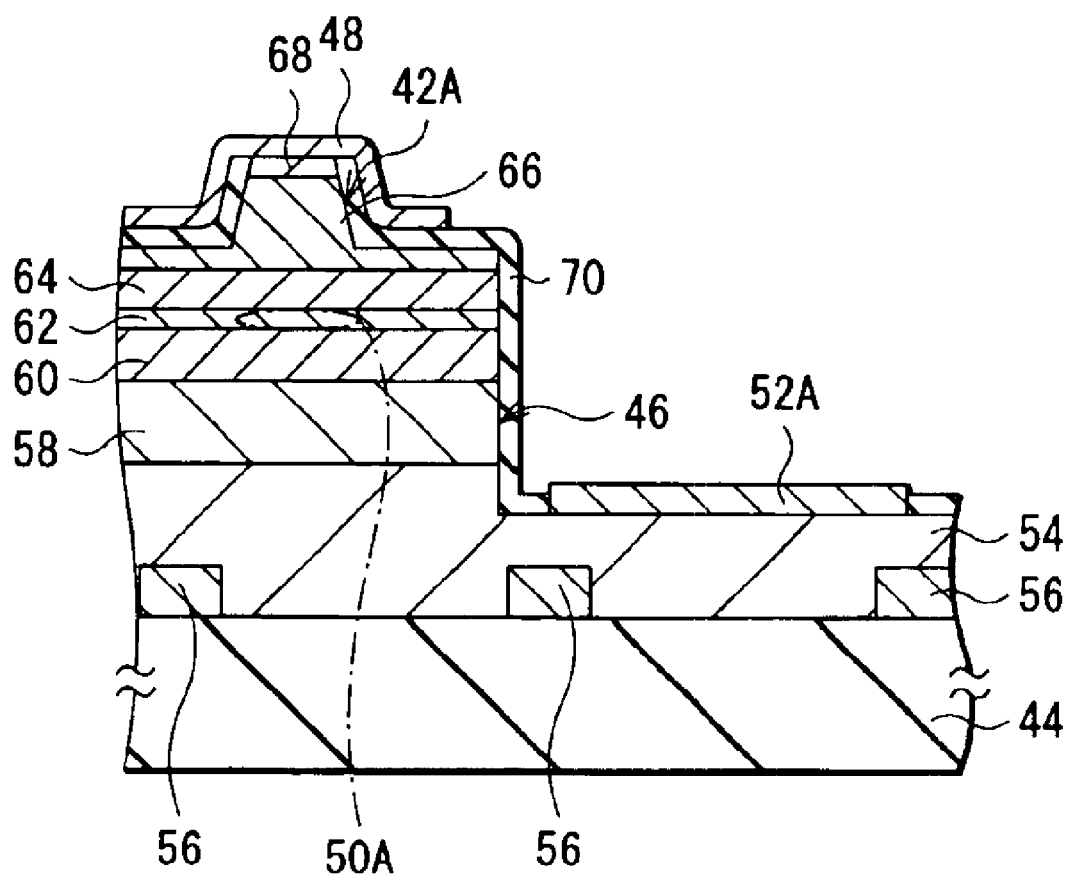
FIG. 2 is a cross section view showing the configuration of each laser oscillating region as illustrated in FIG. 1.

The present embodiment is related to a specific example of a multi-beam semiconductor laser device in accordance with the first invention. FIG. 1 is a schematic cross section view showing the overall configuration of this multi-beam semiconductor laser device. FIG. 2 is a cross section view showing the configuration of a part thereof.

The multi-beam semiconductor laser device 40 in accordance with the present embodiment is a GaN base multi-beam semiconductor laser device, as illustrated in FIG. 1, provided with four laser oscillating regions 42A, 42B, 42C and 42D in the form of stripes which are capable of emitting laser beams with the same wavelength.

The laser oscillating regions 42A to 42D are provided with a p-type common electrode 48 on a mesa structure 46 which is formed on a sapphire substrate 44, and have active regions 50A, SOB, 50C and 50D respectively. Also, two n-type electrodes 52A and 52B are provided on an n-type GaN contact layer 54 and located as common electrodes opposite to the p-type common electrode 48 on both sides of the mesa structure 46.

The width W of the mesa structure 46 in the direction parallel to the sapphire substrate 44 is 250 μm while the distance A between the laser oscillating region 42A and the laser oscillating region 42D is 200 μm. The distance $A_1$ between the laser oscillating region 42A and the laser oscillating region 42B is 16 μm while the distance $A_2$ between the laser oscillating region 42C and the laser oscillating region 42D is 16 μm. Also, the distance $B_1$ between the laser oscillating region 42B and the edge of the n-type electrode 52A just adjacent to the mesa structure 46 is 76 μm while the distance $B_2$ between the laser oscillating region 42C and the edge of the n-type electrode 52B just adjacent to the laser oscillating region is 76 μm.

The distance between the laser oscillating region 42A and the edge of the n-type electrode 52B just adjacent to the laser oscillating region is 260 μm while the distance between the laser oscillating region 42A and the edge of the n-type electrode 52A just adjacent to the laser oscillating region is 60 μm. Furthermore, the distance between the laser oscillating region 42D and the edge of the n-type electrode 52A just adjacent to the laser oscillating region is 260 μm while the distance between the laser oscillating region 42D and the edge of the n-type electrode 52B just adjacent to the laser oscillating region is 60 μm.

In accordance with the present embodiment, the interval between the laser oscillating region 42B and the laser oscillating region 42C is larger than the interval between the laser oscillating region 42A and the laser oscillating region 42B and larger than the laser oscillating region 42C and the laser oscillating region 42D. This is only for the purpose of facilitating the test procedure of the multi-beam semiconductor laser device 40 while it is not requisite to make relatively wider the interval between the laser oscillating region 42B and the laser oscillating region 42C but it is possible to make the interval equal to the interval between the other laser oscillating regions.

The laser oscillating region 42A is an air-ridge type laser oscillating region in which current is confined by an $SiO_2$ film 70 as illustrated in FIG. 2. A GaN seed crystal layer 56, an n-type GaN contact layer 54, an n-type AlGaN cladding layer 58, an n-type GaN light guide layer 60, an active layer 62, a p-type GaN light guide layer 64, a p-type AlGaN cladding layer 66 and a p-type GaN contact layer 68 are sequentially laminated on the C-plane of the sapphire substrate 44 in a laminate structure. Meanwhile, not shown in the figure, a GaN buffer layer may be grown at a low temperature between the sapphire substrate 44 and the GaN seed crystal layer 56.

The upper portion of the p-type AlGaN cladding layer 66 constituting the laser oscillating region 42A and the p-type GaN contact layer 68 are extending in the form of a ridge stripe in one direction. Also, the upper portion of the n-type GaN contact layer 54 and the n-type AlGaN cladding layer 58, the n-type GaN light guide layer 60, the active layer 62, the p-type GaN light guide layer 64 and the lower portion of the p-type AlGaN cladding layer 66 are formed as the mesa structure 46 extending in the same direction as the laser oscillating region 42A is extending. Meanwhile, the mesa structure 46 is formed as a common mesa structure of the laser oscillating region 42A to 42D. In other words, the n-type GaN contact layer 54, the n-type AlGaN cladding layer 58, the n-type GaN light guide layer 60, the active layer 62, the p-type GaN light guide layer 64 and the p-type AlGaN cladding layer 66 are formed as a common laminate structure to the respective laser oscillating region 42A to 42D.

Furthermore, the GaN seed crystal layer 56 is formed as a concavo-convex structure extending in the same direction as the laser oscillating region 42A and the mesa structure 46 are extending while the laser oscillating region 42A is located between two concave portions of the concavo-convex structure.

The laser oscillating region 42A to 42D, the mesa structure 46 and the n-type GaN contact layer 54 adjacent to the mesa structure 46 are coated with the $SiO_2$ film 70 except for the upper surface of the laser oscillating region 42A to 42D and some surface portions of the n-type GaN contact layer 54.

A p-type common electrode 48 made of a multi-layered metallic film such as a Pd/Pt/Au electrode is formed over the respective p-type GaN contact layer 68, as a common ohmic junction electrode to the respective laser oscillating region 42A to 42D, by laminating palladium (Pt), platinum (Pt) and gold (Au) in this order through openings of the $SiO_2$ film 70.

Also, n-type electrodes 52A and 52B made of a multi-layered metallic film such as a Ti/Al/Pt/Au electrode is formed on the n-type GaN contact layer 54 on both sides of the mesa structure 46, as a common ohmic junction electrode to the respective laser oscillating region 42A to 42D, by laminating titanium (Ti), aluminum (Al), platinum and gold in this order through openings of the $SiO_2$ film 70. However, because of the respective distances between the laser oscillating regions 42A to 42D and the n-type electrodes 52A and 52B, the n-type electrode 52A mainly serves as the common electrode to the laser oscillating regions 42A and 42B while the n-type electrode 52B mainly serves as the common electrode to the laser oscillating regions 42C and 42D.

A method of fabricating the multi-beam semiconductor laser device 40 in accordance with the present embodiment will be explained with respect to FIG. 3A to FIG. 3D and FIG. 4A and FIG. 4B.

Figure 3A:
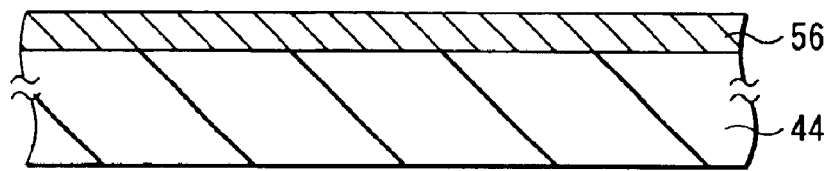
FIG. 3A through FIG. 3D are cross sectional views showing the respective steps of manufacturing the multi-beam semiconductor laser device as illustrated in FIG. 1.

First, as illustrated in FIG. 3A, the GaN seed crystal layer 56 is grown on the C-plane of the sapphire substrate 44 by MOCVD (Metal Organic Chemical Vapor Deposition). When the GaN seed crystal layer 56 is grown on the sapphire substrate 44 sandwiching a GaN buffer layer (not shown in the figure), the GaN buffer layer is grown on the sapphire substrate 44 at a low temperature by MOCVD followed by growing the GaN seed crystal layer 56 on the GaN buffer layer.

Figure 3B:
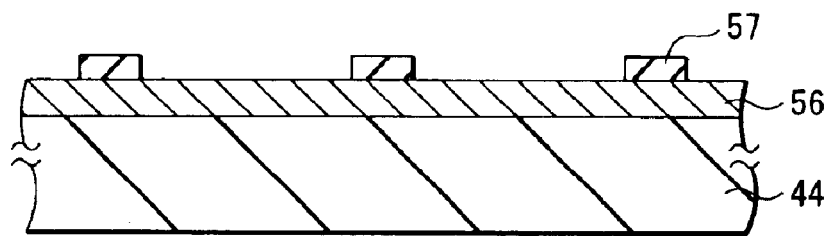

At this time, after displacing the substrate from an MOCVD apparatus, a protective mask 57 is formed on the GaN seed crystal layer 56 in the form of a predetermined stripe extending in a predetermined direction as illustrated in FIG. 3B.

Figure 3C:
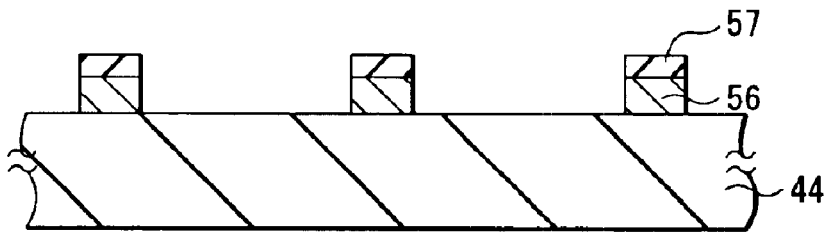
Figure 3D:
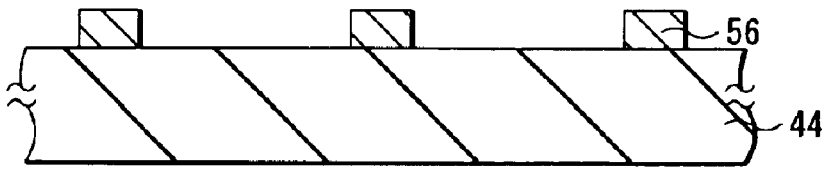

Next, as illustrated in FIG. 3C, the GaN seed crystal layer 56 is etched with the protective mask 57 followed by removing the protective mask 57. By this step, as illustrated in FIG. 3D, the concavo-convex structure of the GaN seed crystal layer 56 is formed on the sapphire substrate 44.

Figure 4A:
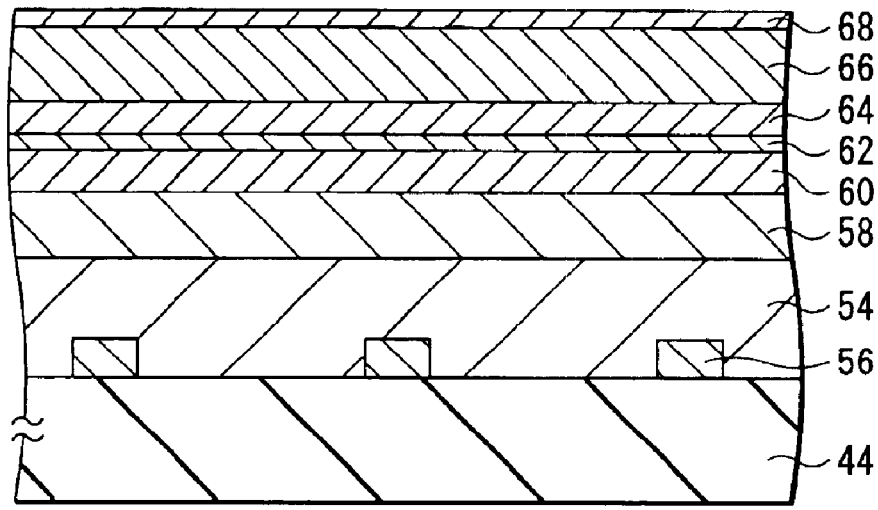
FIG. 4A and FIG. 4B are cross sectional views showing the respective steps following FIG. 3D.
Figure 4B:
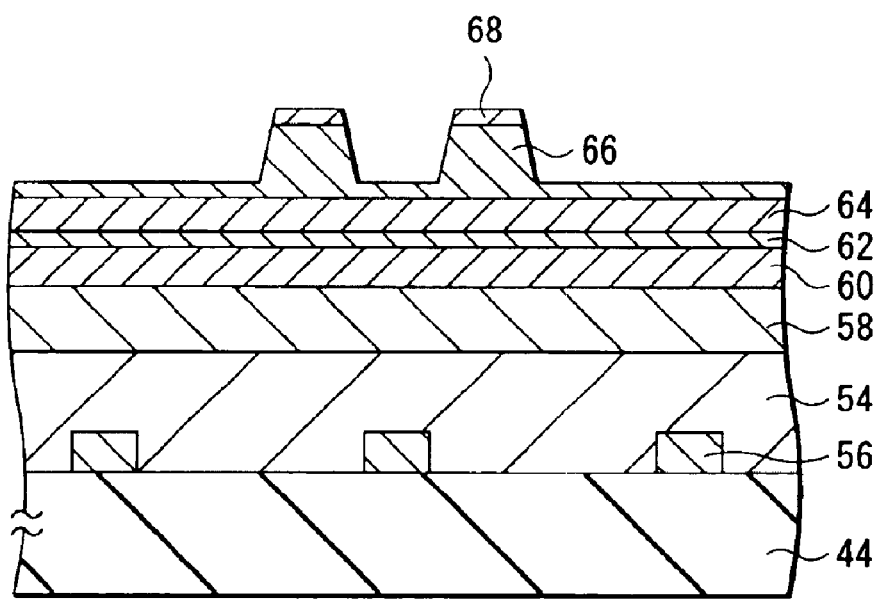

The substrate is placed again in the MOCVD apparatus in which the n-type GaN contact layer 54 is formed as illustrated in FIG. 4A on the GaN seed crystal layer 56 as the convex portion of the concavo-convex structure under a growth condition enabling a quick crystal growth in the lateral direction. Next, an n-type AlGaN cladding layer 58, an n-type GaN light guide layer 60, an active layer 62, a p-type GaN light guide layer 64, a p-type AlGaN cladding layer 66 and a p-type GaN contact layer 68 are sequentially laminated thereon. Next, the laser oscillating region 42A to 42D are formed by etching the p-type GaN contact layer 68 and the upper portions of the p-type AlGaN cladding layer 66 as illustrated in FIG. 4B. However, only the laser oscillating regions 42A and 42B are illustrated in FIG. 4B.

Next, although not shown in the figure, the mesa structure 46 is formed by etching the lower portion of the p-type AlGaN cladding layer 66, the p-type GaN light guide layer 64, the active layer 62, the n-type GaN light guide layer 60, the n-type AlGaN cladding layer 58 and the upper portion of the n-type GaN contact layer 54 on the both sides of the laser oscillating regions 42A and 42D.

Next, after forming and then selectively removing the SiO$_2$ film 70 to form openings therein, the p-type common electrode 48 is formed thereon in order to make contact with the p-type GaN contact layers 68 of the respective laser oscillating regions 42A to 42D as well as the n-type common electrodes 52A and 52B on the n-type GaN contact layer 54 shared by the laser oscillating regions 42A to 42D.

Finally, the wafer (substrate) is diced into bars by cleavage along the plane perpendicular to the laser oscillating regions 42A to 42D, followed by dicing the bars in parallel to the laser oscillating regions 42A to 42D in order to fabricate the multi-beam semiconductor laser device 40 as illustrated in FIG. 1. As explained in the above, in accordance with the present embodiment, the distance A between the laser oscillating region 42A and the laser oscillating region 42D, the distance between the n-type electrode 52A and the laser oscillating region 42D and the distance between the n-type electrode 52B and the laser oscillating region 42A are designed in order to falls within a predetermined range and therefore it is possible to increase and make equal the optical output levels of the respective laser oscillating regions 42A to 42D. Also, since the p-type electrode 48 and the n-type electrodes 52A and 52B are used as common electrodes, it is easy to adjust the alignment when mounting on a sub mount.

Second Embodiment of the First Invention

Figure 5:
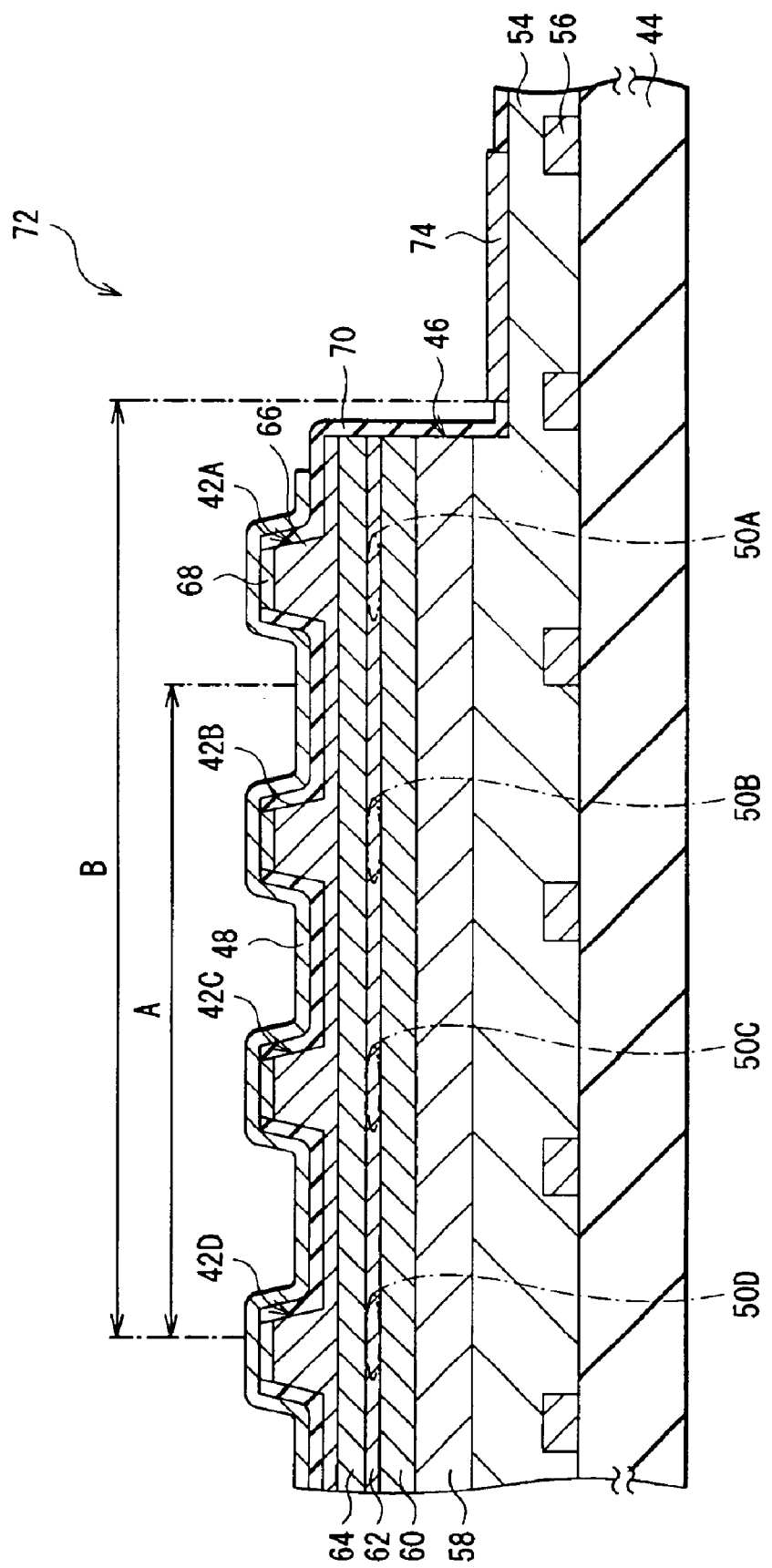
FIG. 5 is a schematic cross section view showing the overall configuration of the multi-beam semiconductor laser device in accordance with a second embodiment of the first invention.

The present embodiment is related to another example of a multi-beam semiconductor laser device in accordance with the first invention. FIG. 5 is a schematic cross section view showing the overall configuration of the multi-beam semiconductor laser device. In FIG. 5, like references indicate similar elements as illustrated in FIG. 1 and FIG. 2, and therefore redundant explanation is not repeated.

The multi-beam semiconductor laser device 72 in accordance with the present embodiment is a GaN base multi-beam semiconductor laser device provided with four laser oscillating regions 42A to 42D as illustrated in FIG. 5 which are capable of emitting laser beams with the same wavelength.

The laser oscillating regions 42A to 42D are provided with a p-type common electrode 48 on a mesa structure 46 which is formed on a sapphire substrate 44, and have active regions 50A to 50D respectively. Also, one n-type electrode 74 are provided on an n-type GaN contact layers 54 and located as a common electrode opposite to the p-type common electrode 48 of the respective laser oscillating regions 42A to 42D on one side of a mesa structure 46.

In the case of the present embodiment, the intervals between adjacent ones of the laser oscillating regions 42A to 42D are equal to each other. Also, the width W of the mesa structure 46 in the direction parallel to the sapphire substrate 44 is 200 µm to 300 µm while the distance A between the laser oscillating region 42A and the laser oscillating region 42D is 48 µm. The distance B between the laser oscillating region 42D and the edge of the n-type electrode 74 just adjacent to the laser oscillating region is 108 µm while the distance between the laser oscillating region 42A and the edge of the n-type electrode 74 just adjacent to the laser oscillating region is 60 µm. The configuration of the respective laser oscillating regions 42A to 42D and the laminate structure under these areas are designed corresponding to those of the multi-beam semiconductor laser device 40 in accordance with the first embodiment of the first invention.

Also, in the case of the multi-beam semiconductor laser device 72 in accordance with the present embodiment, there are the same advantages as in the case of the multi-beam semiconductor laser device 40 in accordance with the first embodiment of the first invention.

Third Embodiment of the First Invention

Figure 6:
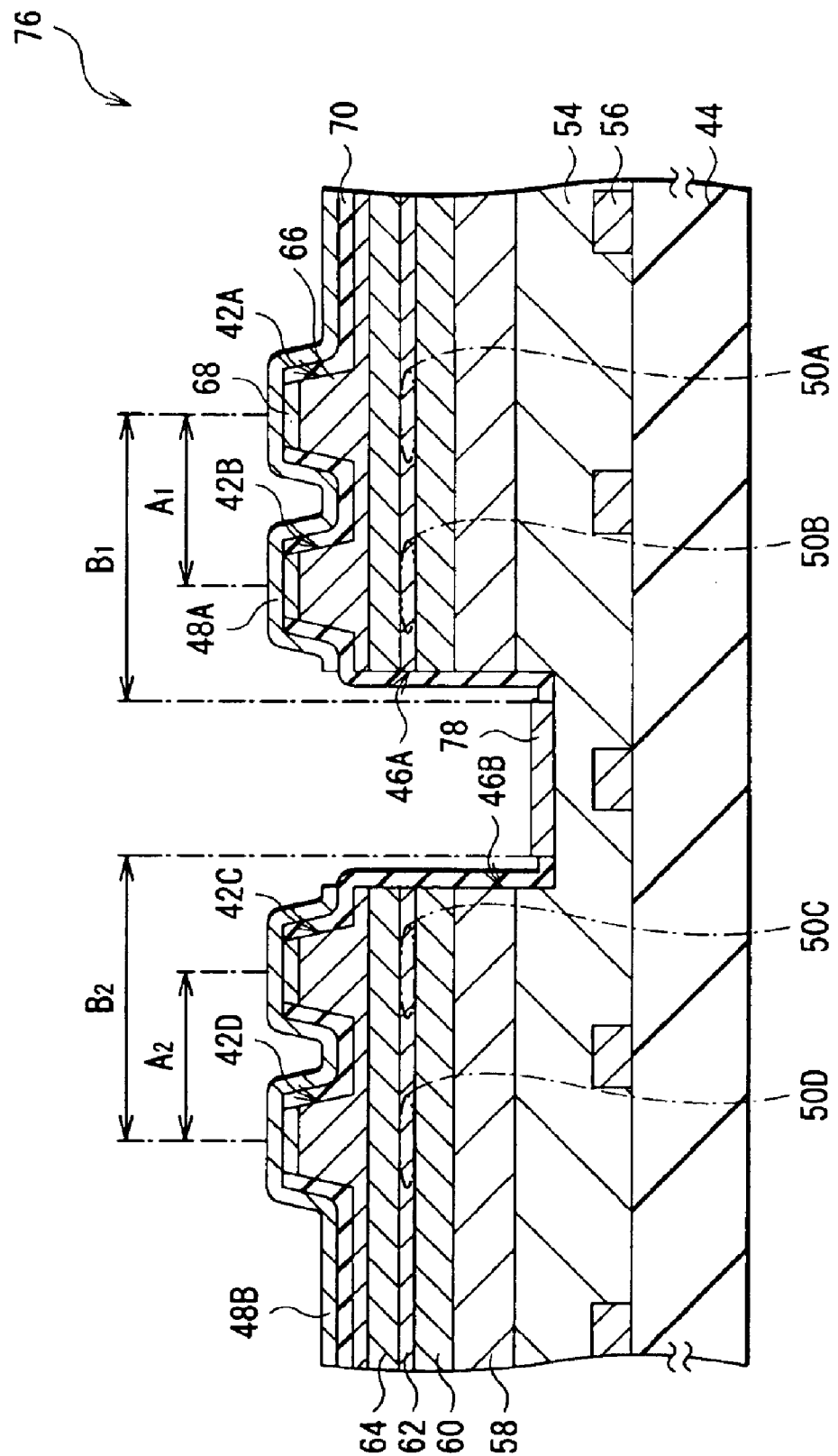
FIG. 6 is a schematic cross section view showing the overall configuration of the multi-beam semiconductor laser device in accordance with a third embodiment of the first invention.

The present embodiment is related to a further example of a multi-beam semiconductor laser device in accordance with the first invention. FIG. 6 is a schematic cross section view showing the overall configuration of the multi-beam semiconductor laser device. In FIG. 6, like references indicate similar elements as illustrated in FIG. 1 and FIG. 2, and therefore redundant explanation is not repeated.

The multi-beam semiconductor laser device 76 in accordance with the present embodiment is a GaN base multi-beam semiconductor laser device provided with four laser oscillating regions 42A to 42D as illustrated in FIG. 6 which are capable of emitting laser beams with the same wavelength.

The laser oscillating regions 42A and 42B are provided with a p-type common electrode 48A on a mesa structure 46A which is formed on a sapphire substrate 44, and have active regions 50A and 50B respectively. The laser oscillating regions 42C and 42D are provided with a p-type common electrode 48B on a mesa structure 46B which is formed on a sapphire substrate 44, and have active regions 50C and 50D respectively.

Also, one n-type electrode 78 are provided on an n-type GaN contact layers 54 between the mesa structure 46A and the mesa structure 46B and located as a common electrode opposite to the p-type common electrode 48A of the respective laser oscillating regions 42A and 42B and opposite to the p-type common electrode 48B of the laser oscillating regions 42C and 42D. The mesa structure 46A and the laser oscillating regions 42A and 42B, and the mesa structure 46B and the laser stripes 42C and 42D are symmetrically provided with the n-type electrode 78 as the center of inversion.

The widths W of the mesa structures 46A and 46B in the direction parallel to the substrate are 150 $\mu$m to 250 $\mu$m respectively while the distance $A_1$ between the laser oscillating region 42A and the laser oscillating region 42B and the distance $A_2$ between the laser oscillating region 42C and the laser oscillating region 42D are 16 $\mu$m respectively.

The distance $B_1$ between the laser oscillating region 42A and the n-type electrode 78 and the distance $B_2$ between the laser oscillating region 42D and the n-type electrode 78 are 76 $\mu$m respectively while the distance between the laser oscillating region 42B and the n-type electrode 78 and the distance between the laser oscillating region 42C and the edge of the n-type electrode 78 are 60 $\mu$m respectively The configuration of the respective laser oscillating regions 42A to 42D and the laminate structures under these areas are designed corresponding to those of the multi-beam semiconductor laser device 40 in accordance with the first embodiment of the first invention.

Also, in the case of the multi-beam semiconductor laser device 76 in accordance with the present embodiment, there are the same advantages as in the case of the multi-beam semiconductor laser device 40 in accordance with the first embodiment of the first invention.

Fourth Embodiment of the First Invention

Figure 7:
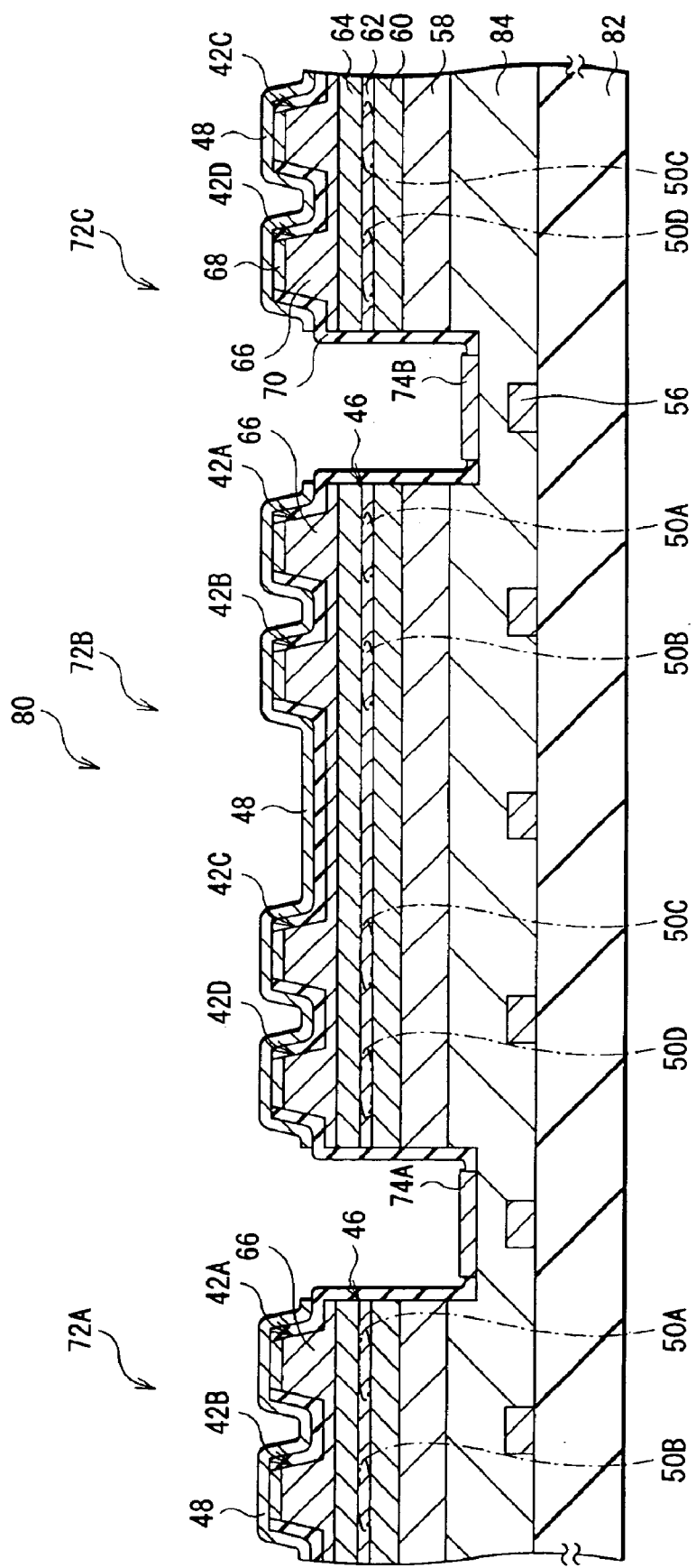
FIG. 7 is a schematic cross section view showing the overall configuration of the multi-beam semiconductor laser device in accordance with a fourth embodiment of the first invention.

The present embodiment is related to a further example of a multi-beam semiconductor laser device in accordance with the first invention. FIG. 7 is a schematic cross section view showing the overall configuration of the multi-beam semiconductor laser device. In FIG. 7, like references indicate similar elements as illustrated in FIG. 1 and FIG. 2, and therefore redundant explanation is not repeated.

The multi-beam semiconductor laser device 80 in accordance with the present embodiment is a multi-beam semiconductor laser array composed of multi-beam semiconductor laser devices 72 arranged in parallel on a common substrate 82 as illustrated in FIG. 7 (for the sake of clarity in explanation, only three multi-beam semiconductor laser device 72A, 72B and 72C are illustrated in FIG. 7 while the multi-beam semiconductor laser devices 72A and 72B are partially illustrated). Each multi-beam semiconductor laser device is provided with four laser oscillating regions 42A to 42D which are capable of emitting laser beams with the same wavelength.

The n-type electrode 74A formed on the common n-type GaN contact layer 84 located between the multi-beam semiconductor laser device 72A and the multi-beam semiconductor laser device 72B serves as the n-type common electrode of the multi-beam semiconductor laser device 72A and the multi-beam semiconductor laser device 72B, particularly as the n-type common electrode of the laser oscillating regions 42A and 42B of the multi-beam semiconductor laser device 72A and the laser oscillating regions 42C and 42D of the multi-beam semiconductor laser device 72B.

In the same way, the n-type electrode 74B formed on the common n-type GaN contact layer 84 located between the multi-beam semiconductor laser device 72B and the multi-beam semiconductor laser device 72C serves as the n-type common electrode of the multi-beam semiconductor laser device 72B and the multi-beam semiconductor laser device 72C, particularly, serves as the n-type common electrode of the laser oscillating regions 42A and 42B of the multi-beam semiconductor laser device 72B and the laser oscillating regions 42C and 42D of the multi-beam semiconductor laser device 72C.

Each of the multi-beam semiconductor laser devices 40, 72, 76 and 80 in accordance with the first to fourth embodiments of the first invention is mounted, in a junction down fashion, on a sub mount which is provided with first junction electrodes to be electrically connected to the n-type electrode and second junction electrodes to be electrically connected to the p side electrode.

Figure 8:
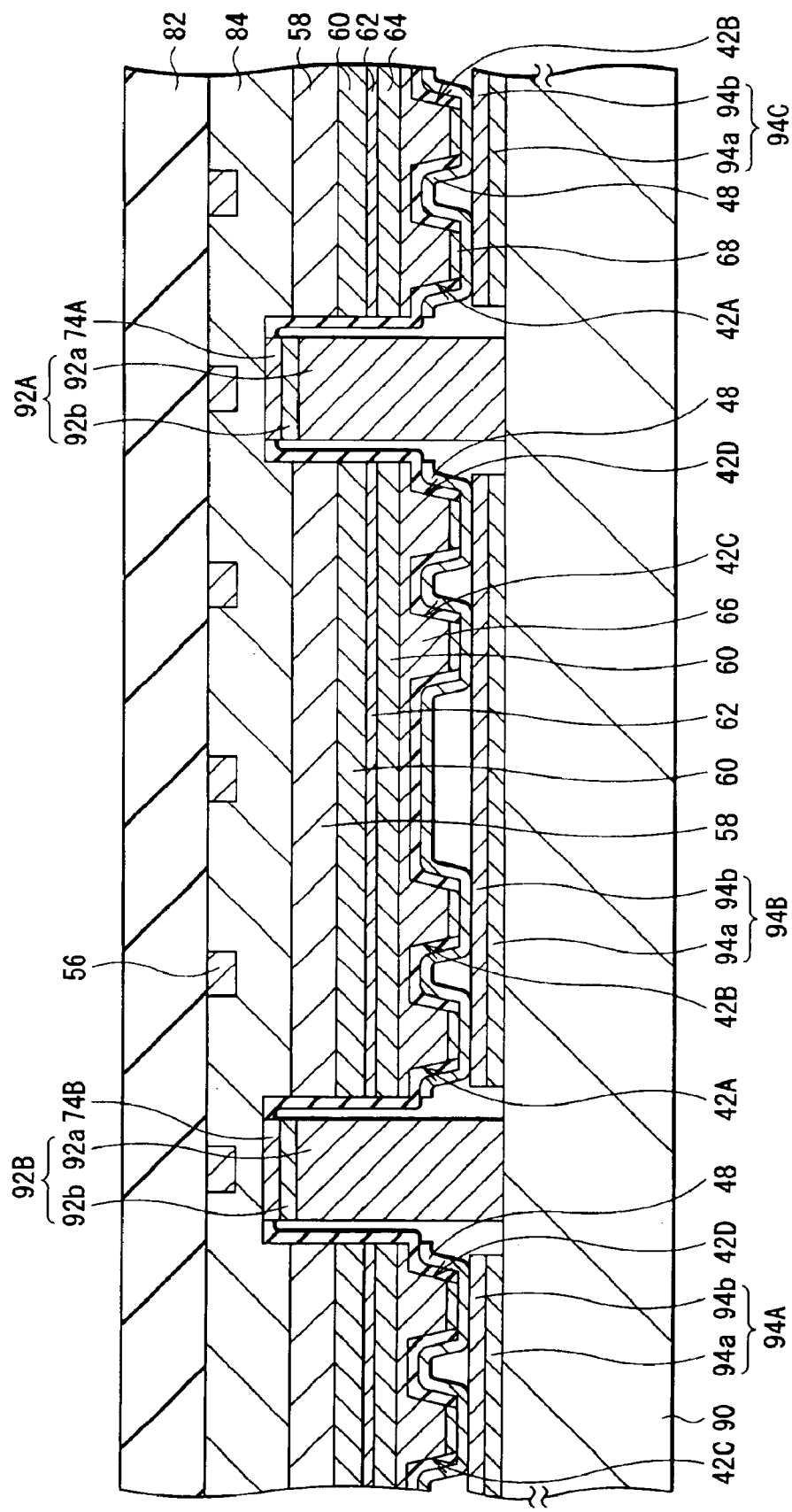
FIG. 8 is a schematic cross section view showing the multi-beam semiconductor laser device as illustrated in FIG. 7 connected to a sub mount in a junction down fashion.

For example, the multi-beam semiconductor laser device 80 in accordance with the fourth embodiment of the first invention is mounted, in a junction down fashion, on a sub mount 90 which is provided with first junction electrodes 92A and 92B to be electrically connected to the n-type electrode 74A and 74B and second junction electrodes 94A, 94B and 94C to be electrically connected to the p side electrode 48 as illustrated in FIG. 8.

The sub mount 90 is a member in the form of a plate made of AlN. The first junction electrodes 92A and 92B is formed on the sub mount 90 as illustrated in FIG. 8 and made of dual layered metallic film comprising a Ti/Pt/Au layer 92a which is formed by laminating titanium, platinum and gold on the sub mount 90 in this order and has a large film thickness, and a Ti/Ag/Sn layer 92b which is formed by laminating titanium, silver (Ag) and tin (Sn) in this order and has a small film thickness. The film thickness of Ti/Pt/Au layer 92a is adjusted in order that the height of the first junction electrode is larger than that of the second junction electrodes 94A to 94C corresponding to the differential height between the p-type common electrode 48 and the n-type electrodes 74A and 74B of the multi-beam semiconductor laser device.

The second junction electrodes 94A to 94C are formed on the sub mount 90 and comprises a dual layered metallic film formed on the sub mount 90 and composed of a Ti/Pt/Au layer 94a which is laminated on the sub mount 90 and a Ti/Ag/Sn layer 94b which is laminated on the Ti/Pt/Au layer 94a with the substantially same film thickness as illustrated in FIG. 8.

Figure 9:
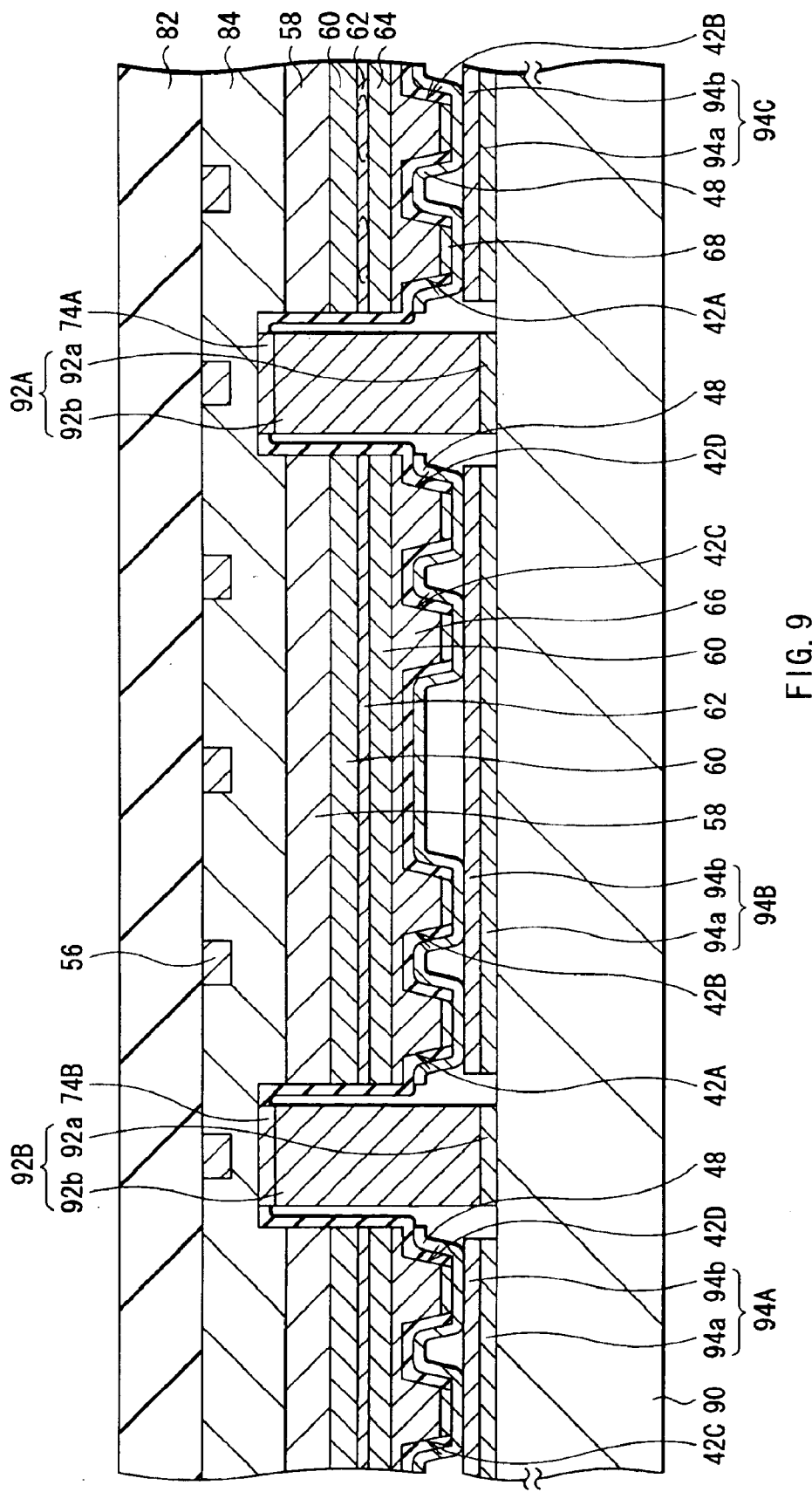
FIG. 9 is a schematic cross section view showing the multi-beam semiconductor laser device as illustrated in FIG. 7 connected to another sub mount in a junction down fashion.
Figure 10:
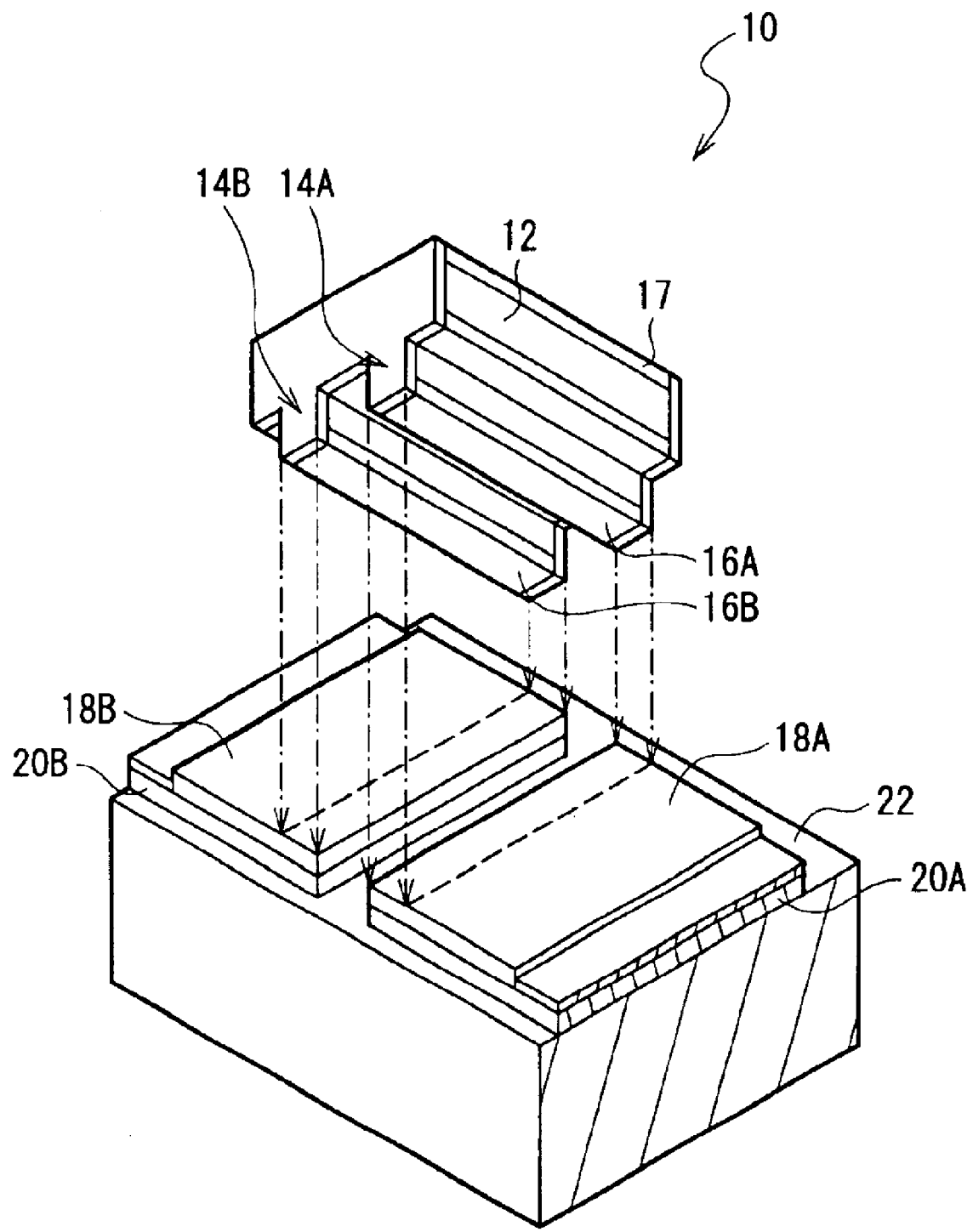
FIG. 10 is a perspective expanded view showing a configuration of a multi-beam semiconductor laser device in accordance with a first exemplary prior art technique.
Figure 11:
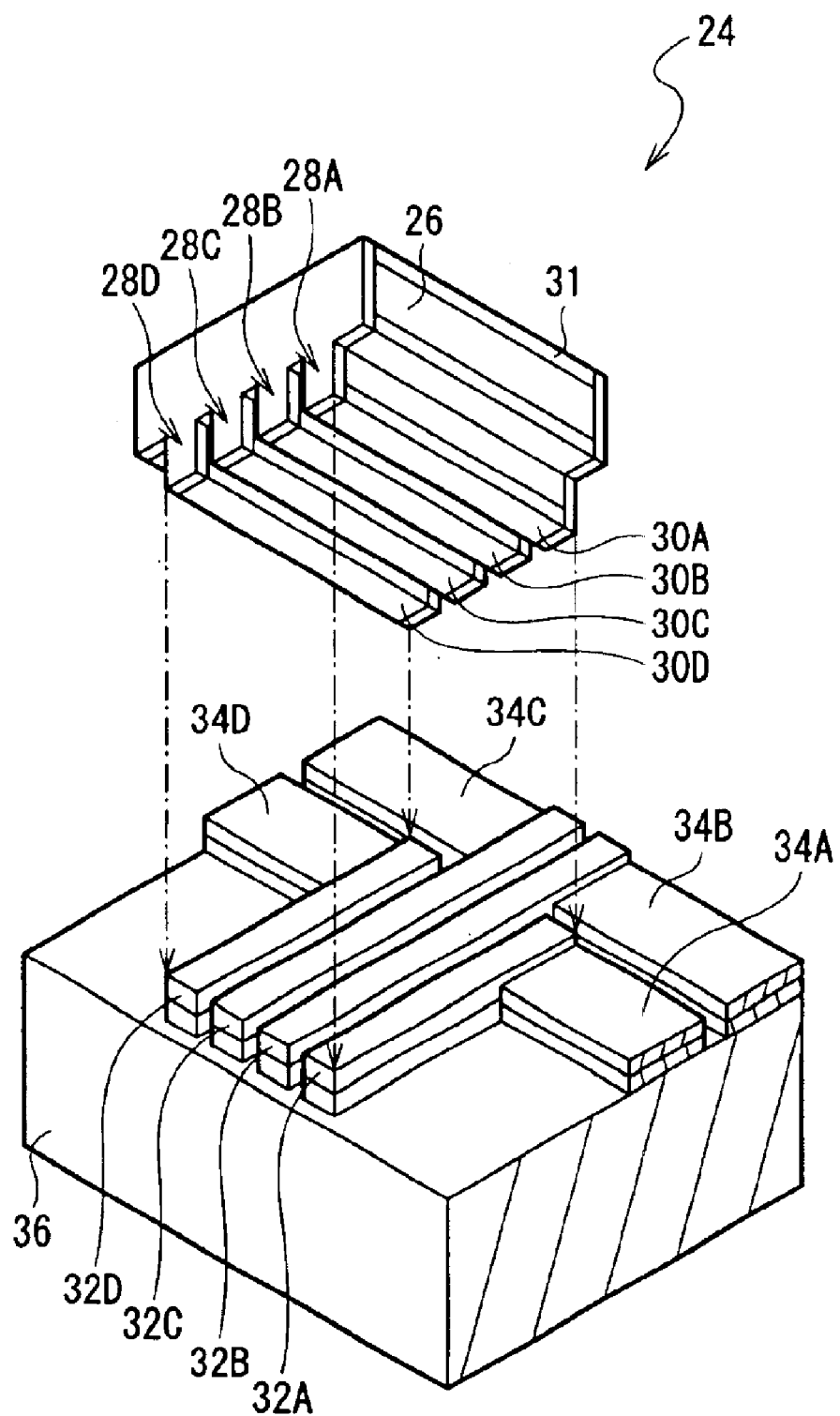
FIG. 11 is a perspective expanded view showing a configuration of a multi-beam semiconductor laser device in accordance with a second exemplary prior art technique.

Also, as illustrated in FIG. 9, the first junction electrode 92 is formed from the Ti/Pt/Au layer 92a having a small film thickness and the Ti/Ag/Sn layer 92b having a large film thickness. The film thickness of Ti/Ag/Sn layer 92b is adjusted in order that the height of the first junction electrode is larger than that of the second junction electrodes 94A to 94C corresponding to the differential height between the p-type common electrode 48 and the n-type electrodes 74A and 74B of the multi-beam semiconductor laser device.

Embodiment of the Second Invention

Figure 12:
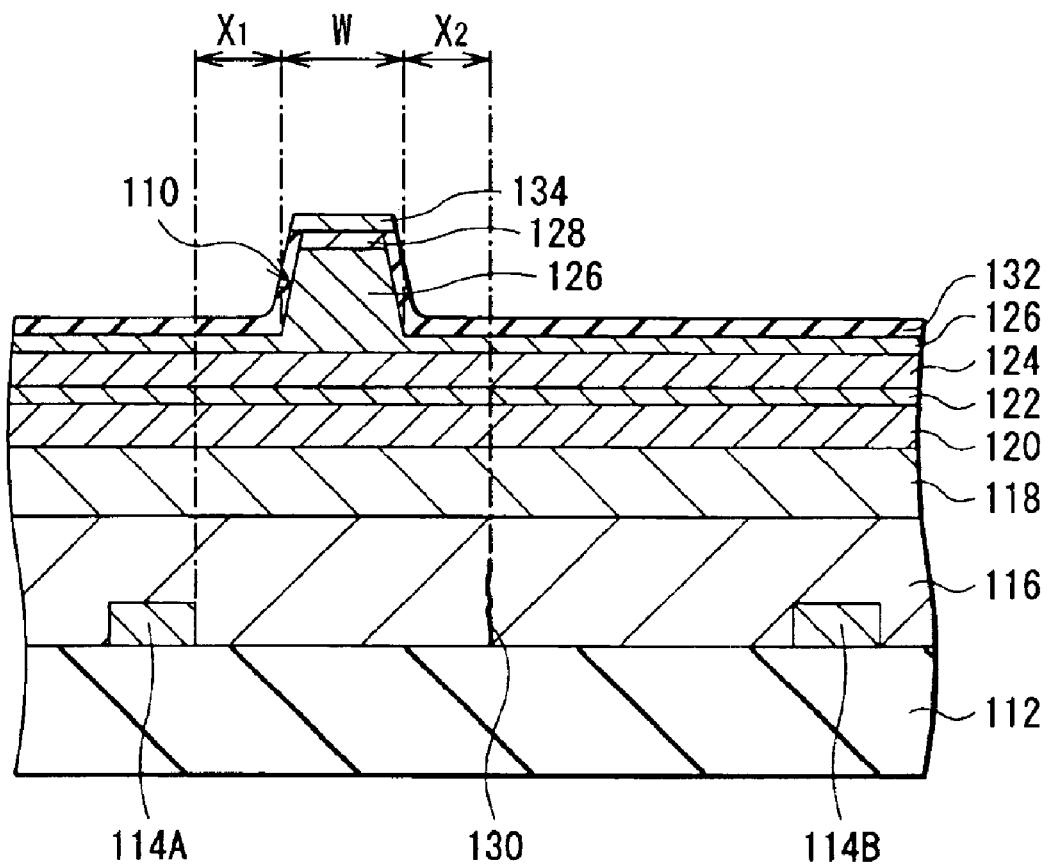
FIG. 12 is a cross section view showing the location of a seed crystal area and a meeting location in relation to the location of a laser oscillating region, as well as the configuration of the laser oscillating region, in the case of the multi-beam semiconductor laser device in accordance with a second invention.

The present embodiment is related to an example of a multi-beam semiconductor laser device in accordance with the second invention. FIG. 12 is a cross section view showing the location of the seed crystal area and the meeting location in relation to the location of a laser oscillating region as well as the configuration of the laser oscillating region in accordance with the present embodiment.

The laser oscillating region 110 of the multi-beam semiconductor laser device in accordance with the present embodiment is a ridge-type laser oscillating region in which current is confined by an $SiO_2$ film 132 as illustrated in FIG. 12.

An n-type GaN contact layer 116 is provided on the C-plane of the sapphire substrate 112 by a lateral growth process from GaN seed crystal members 114A and 114B which are periodically formed. Meanwhile, although not shown in the figure, a GaN buffer layer may be formed between the sapphire substrate 112 and the GaN seed crystal members 114A and 114B by a growth process at a low temperature. A laminate structure is formed on the n-type GaN contact layer 116 by sequentially laminating an n-type AlGaN cladding layer 118, an n-type GaN light guide layer 120, an active layer 122, a p-type GaN light guide layer 124, a p-type AlGaN cladding layer 126 and a p-type GaN contact layer 128. The regions located above the GaN seed crystal members 114A and 114B are high density defective regions. Furthermore, located midway between the GaN seed crystal member 114A and the GaN seed crystal member 114B is a meeting location 130 which is another high density defective region.

The upper portion of the p-type AlGaN cladding layer 126 and the p-type GaN contact layer 128 comprise the laser oscillating region 110, and are extending in one direction in the form of a ridge stripe as located in the low density defective region between the GaN seed crystal member 114A and the meeting location 130.

The laser oscillating region 110 is coated with the $SiO_2$ film 132 and provided with a p-type electrode 134 on the p-type GaN contact layer 128 through an opening of the $SiO_2$ film 132.

Also, not shown in the figure, an n-type electrode is formed on the n-type GaN contact layer 116 adjacent to a mesa structure on top of which the laser oscillating region 110 is located.

In the case where the width of the laser oscillating region 110 is W, where the distance between the laser oscillating region 110 and the GaN seed crystal member 114A is $X_1$, and where the distance between the laser oscillating region 110 and the meeting location 130 is $X_2$, then W is for example 1.6 μm, $X_1$ satisfies $X_1 \geq 0.5$ μm for example 2 μm, and $X_2$ satisfies $X_2 \geq 0.5$ μm for example 2 μm.

As explained in the above, in accordance with the present embodiment, since the laser oscillating region 110 is formed on the low density defective region between the GaN seed crystal member 114A and the meeting location 130, it is possible to obtain good laser characteristics and a long device life cycle.

Also, it is possible to realize a semiconductor laser device capable of emitting beams at a high output power level by implementing a plurality of the laser oscillating regions 110 in accordance with the present embodiment in a multi-beam semiconductor laser device.

Embodiment of the Third Invention

Figure 13:
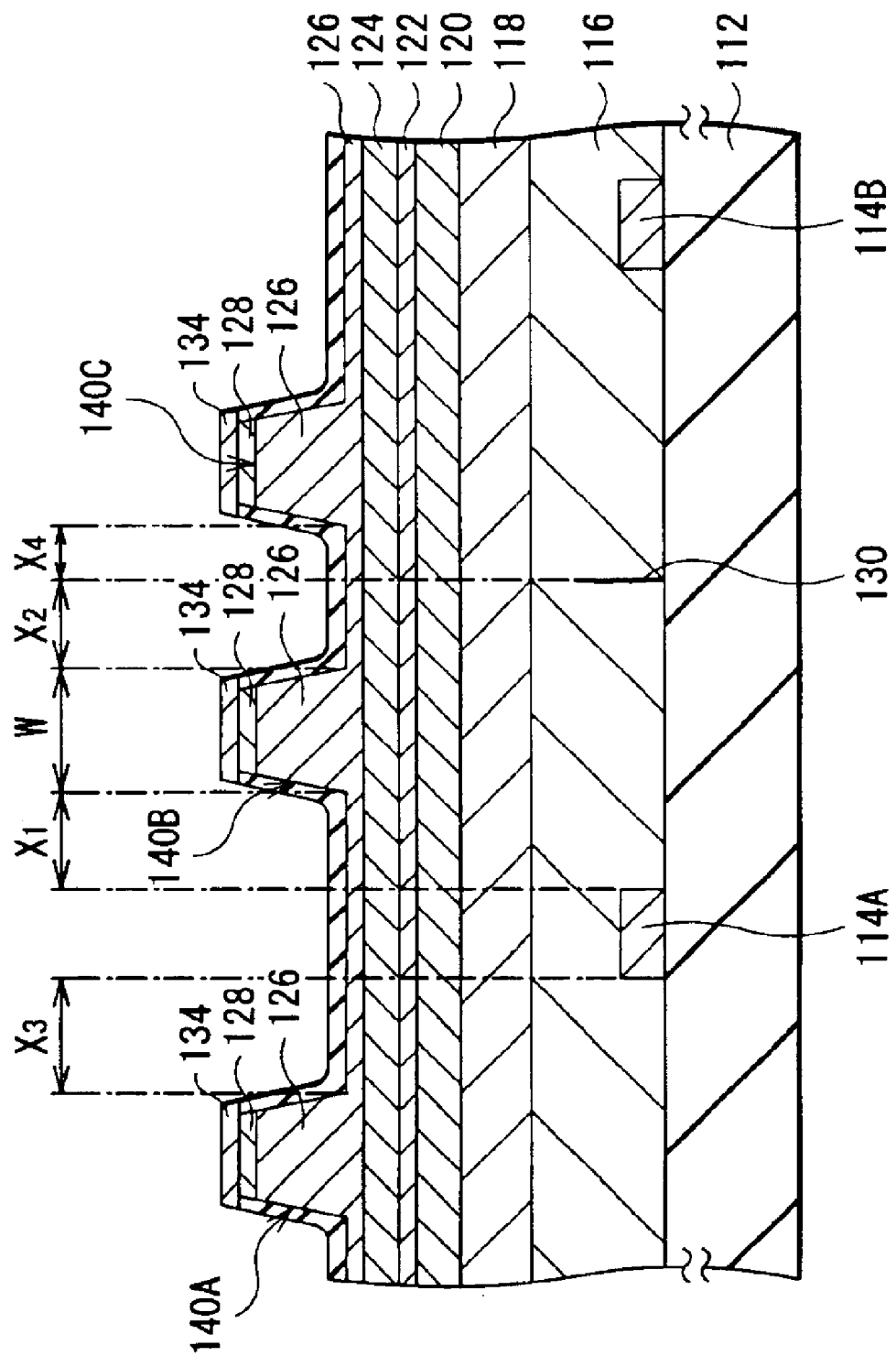
FIG. 13 is a cross section view showing the location of a seed crystal area and a meeting location in relation to the location of a laser oscillating region, as well as the configuration of the laser oscillating region, in the case of the multi-beam semiconductor laser device in accordance with a third invention.

The present embodiment is related to an example of a multi-beam semiconductor laser device in accordance with the third invention. FIG. 13 is a cross section view showing the location of the seed crystal area and the meeting location in relation to the location of a laser oscillating region as well as the configuration of the laser oscillating region in accordance with the present embodiment. In FIG. 13, like references indicate similar elements as illustrated in FIG. 12, and therefore redundant explanation is not repeated.

The laser oscillating regions 140A, 140B and 140C of the multi-beam semiconductor laser device in accordance with the present embodiment are located on low density defective regions respectively, each adjacent ones of the low density defective regions being located with the GaN seed crystal member 114 or the meeting location 130 inbetween.

Namely, the laser oscillating region 140A and the laser oscillating region 140B are located in the low density defective regions adjacent to each other with the GaN seed crystal member 114A inbetween. Also, the laser oscillating region 140B and the laser oscillating region 140C are located in the low density defective regions adjacent to each other with the meeting location 130 inbetween.

The laser oscillating region 140B has the same spatial relationship to the GaN seed crystal member 114A and the meeting location 130 as in the embodiment of the second invention. In the case where the width of the laser oscillating region 140B is W, where the distance between the GaN seed crystal member 114A and the laser oscillating region 140B is $X_1$, and where the distance between the laser oscillating region 140B and the meeting location 130 is $X_2$, then W is for example 1.6 μm, $X_1$ satisfies $X_1 \geq 0.5$ μm for example 2 μm, and $X_2$ satisfies $X_2 \geq 0.5$ μm for example 2 μm.

On the other hand, the laser oscillating region 140A and the laser oscillating region 140C has the same width as the laser oscillating region 140B.

In the case where the distance between the laser oscillating region 140A and the GaN seed crystal member 114A is $X_3$ and where the distance between the meeting location 130 and the laser oscillating region 140C is $X_4$, then $X_3$ satisfies $X_3 \geq 0.5$ μm for example 2 μm, and $X_4$ satisfies $X_4 \geq 0.5$ μm for example 2 μm.

As explained in the above, in accordance with the present embodiment, since the laser oscillating regions 140A to 140C are formed on the low density defective regions between the GaN seed crystal members and the meeting locations, it is possible to obtain good laser characteristics and a long device life cycle.

Also, it is possible to realize a semiconductor laser device capable of emitting beams at a high output power level by implementing a plurality of the laser oscillating regions 140A to 140C in accordance with the present embodiment in a multi-beam semiconductor laser device.

Embodiment of the Fourth Invention

Figure 14:
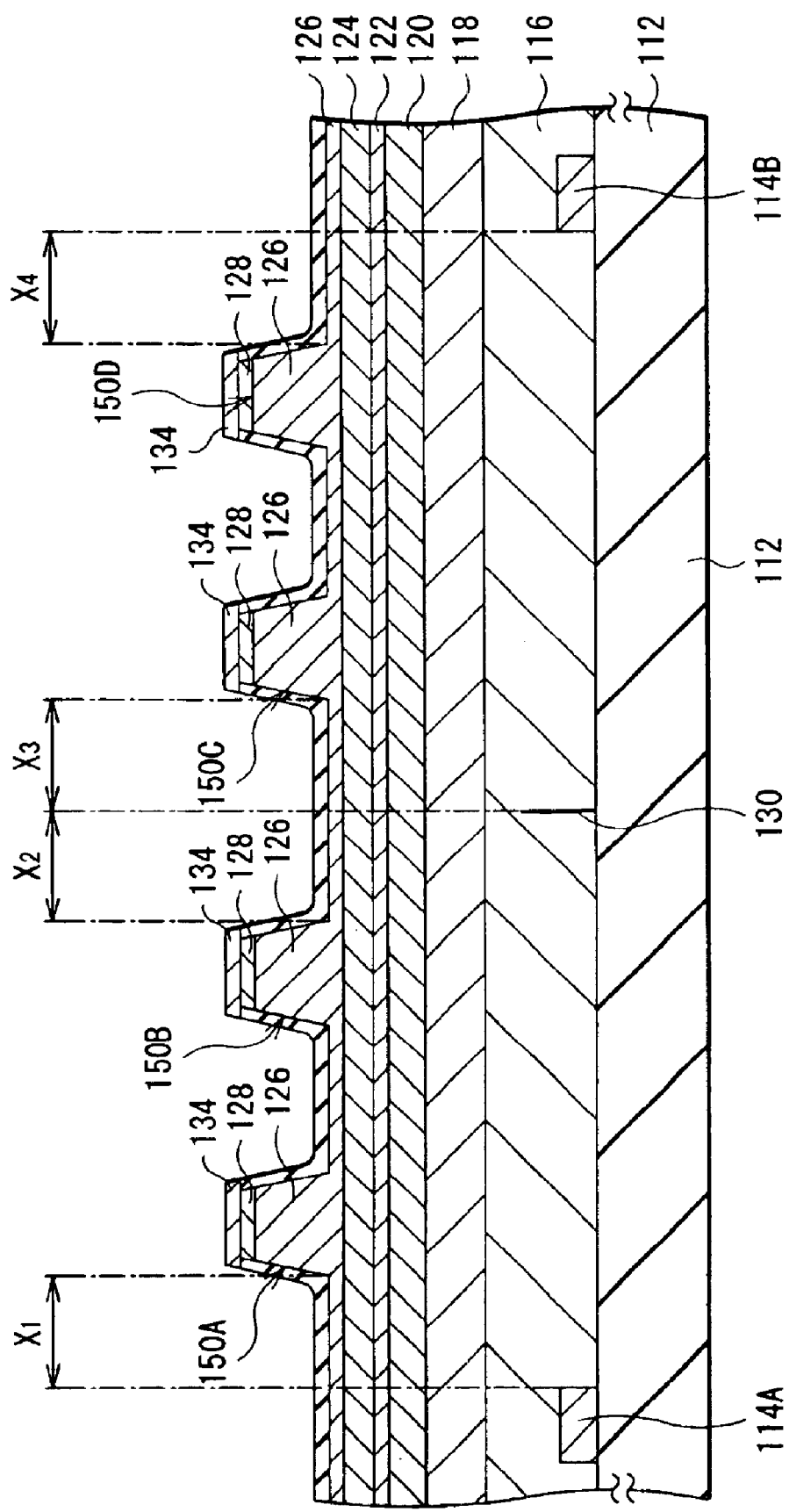
FIG. 14 is a cross section view showing the location of a seed crystal area and a meeting location in relation to the location of a laser oscillating region, as well as the configuration of the laser oscillating region, in the case of the multi-beam semiconductor laser device in accordance with a fourth invention.

The present embodiment is related to an example of a multi-beam semiconductor laser device in accordance with the fourth invention. FIG. 14 is a cross section view showing the location of the seed crystal area and the meeting location in relation to the location of a laser oscillating region as well as the configuration of the laser oscillating region in accordance with the present embodiment. In FIG. 14, like references indicate similar elements as illustrated in FIG. 12, and therefore redundant explanation is not repeated.

The laser oscillating regions 150A, 150B, 150C and 150D of the multi-beam semiconductor laser device in accordance with the present embodiment are located on low density defective regions respectively, each adjacent ones of the low density defective regions being located with the GaN seed crystal member 114A or 114B or the meeting location 130 inbetween. In this case, two of the laser oscillating regions are located on each low density defective region.

Namely, the laser oscillating regions 150A and 150B are located on the low density defective region between the GaN seed crystal member 114A and the meeting location 130. Also, the laser oscillating regions 150C and 150D are located on the low density defective region between the meeting location 130 and the GaN seed crystal member 114B.

The laser oscillating regions 150A to 150D have the same width W, for example, 1.6 μm.

In the case where the distance between the GaN seed crystal member 114A and the laser oscillating region 150A is $X_1$, where the distance between the laser oscillating region 150B and the meeting location 130 is $X_2$, where the distance between the meeting location 130 and the laser oscillating region 150C is $X_3$, and where the distance between the laser oscillating region 150D and the GaN seed crystal member 114B is $X_4$, then $X_1$, $X_2$, $X_3$ and $X_4$ are no smaller than 0.5 µm respectively, for example, 2 µm, 2 µm, 2 µm and 2 µm, As explained in the above, in accordance with the present embodiment, since the laser oscillating regions 150A to 150D are formed on the low density defective regions between the GaN seed crystal members and the meeting locations, it is possible to obtain good laser characteristics and a long device life cycle.

Also, it is possible to realize a semiconductor laser device capable of emitting beams at a high output power level by implementing a plurality of the laser oscillating regions 150A to 150D in accordance with the present embodiment in a multi-beam semiconductor laser device.

Embodiment of the Fifth Invention

Figure 15:
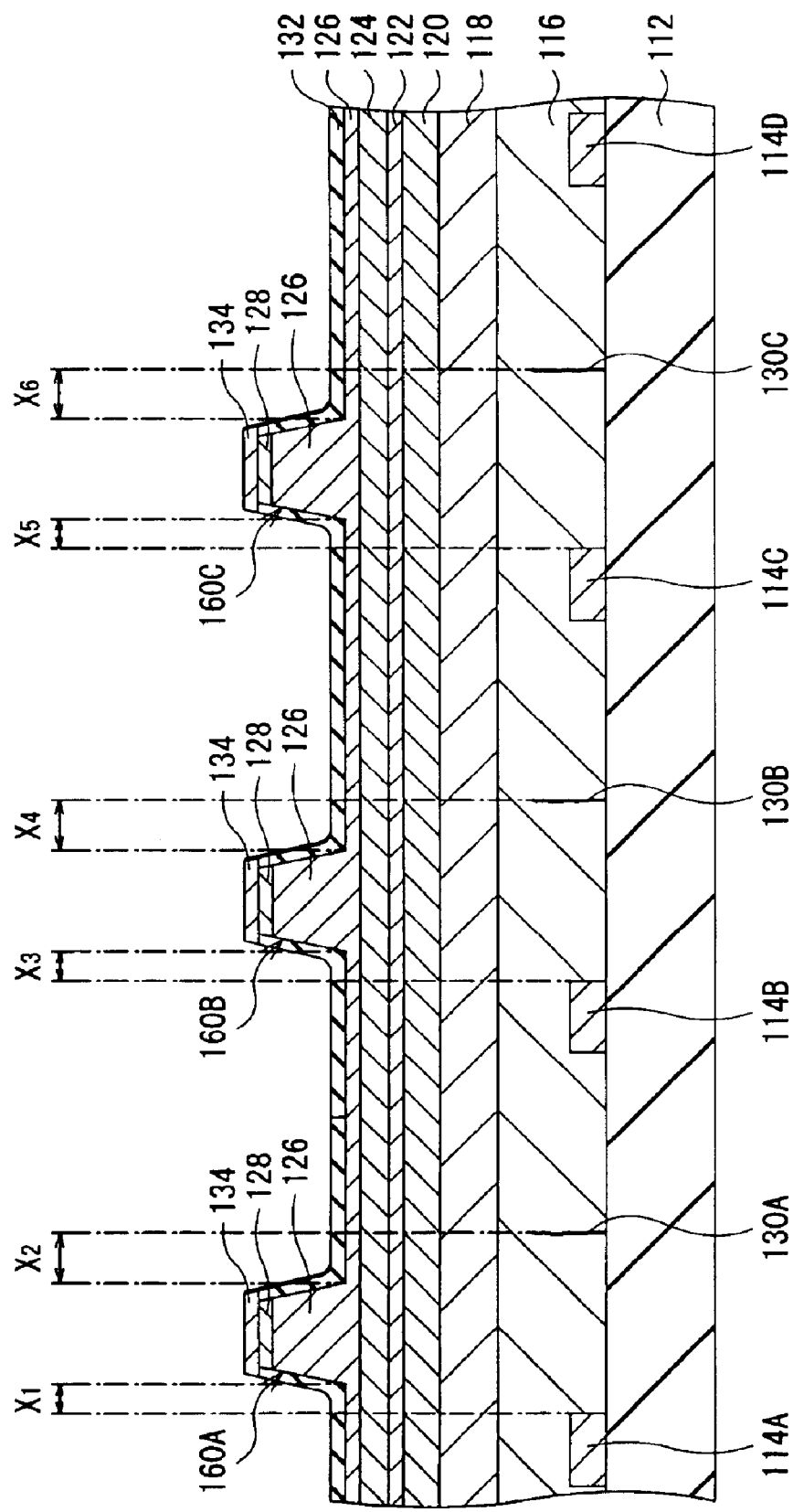
FIG. 15 is a cross section view showing the location of a seed crystal area and a meeting location in relation to the location of a laser oscillating region, as well as the configuration of the laser oscillating region, in the case of the multi-beam semiconductor laser device in accordance with a fifth invention.
Figure 16A:
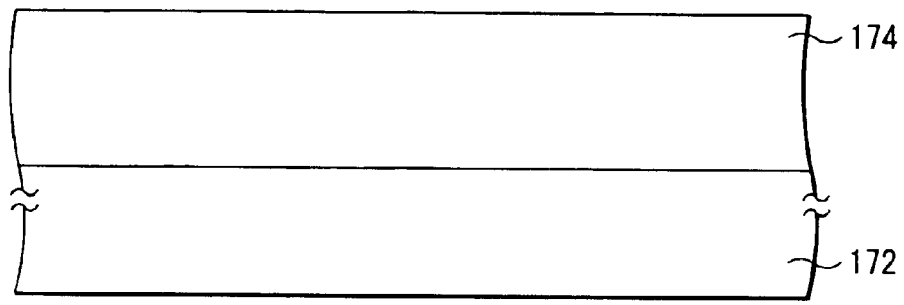
FIG. 16A through FIG. 16C are cross sectional views explaining the respective steps of a growth technique in the lateral direction by an FS-ELO technique.
Figure 16B:
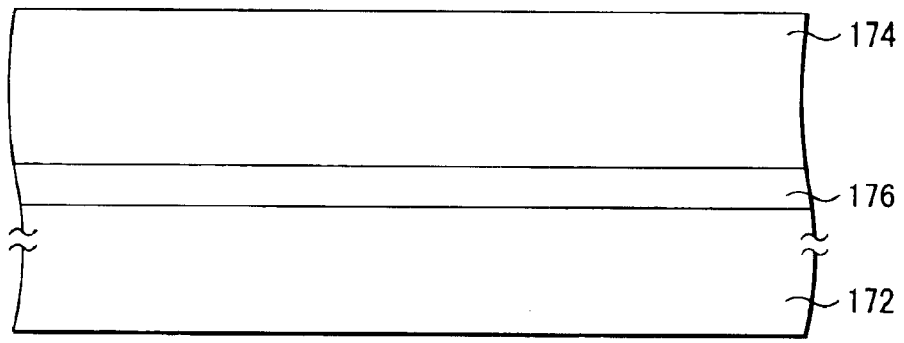
Figure 16C:
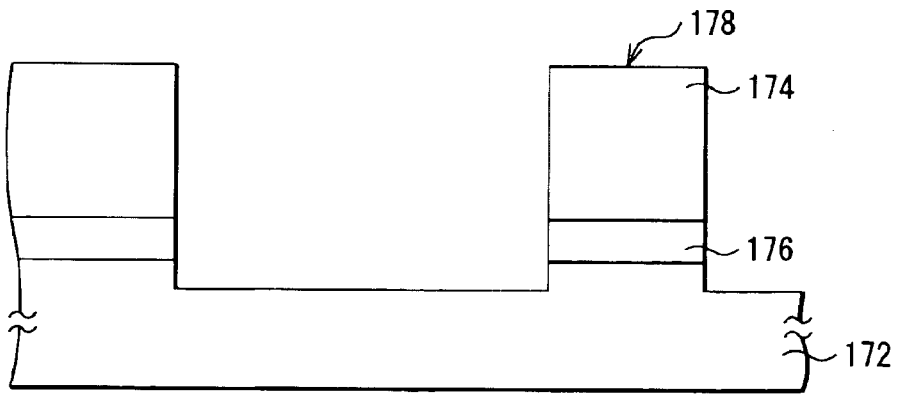
Figure 17A:
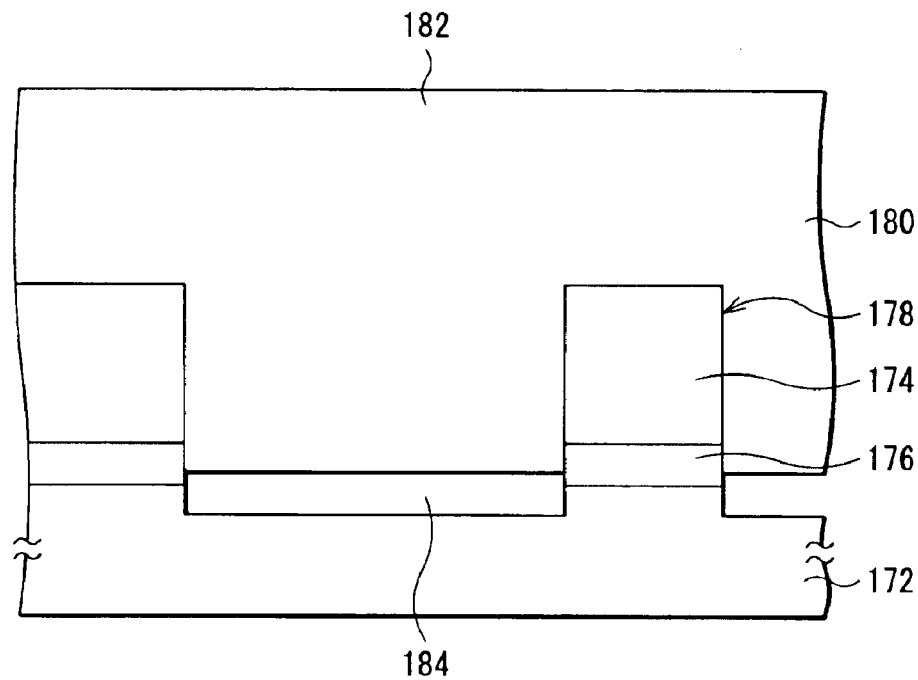
Figure 17B:
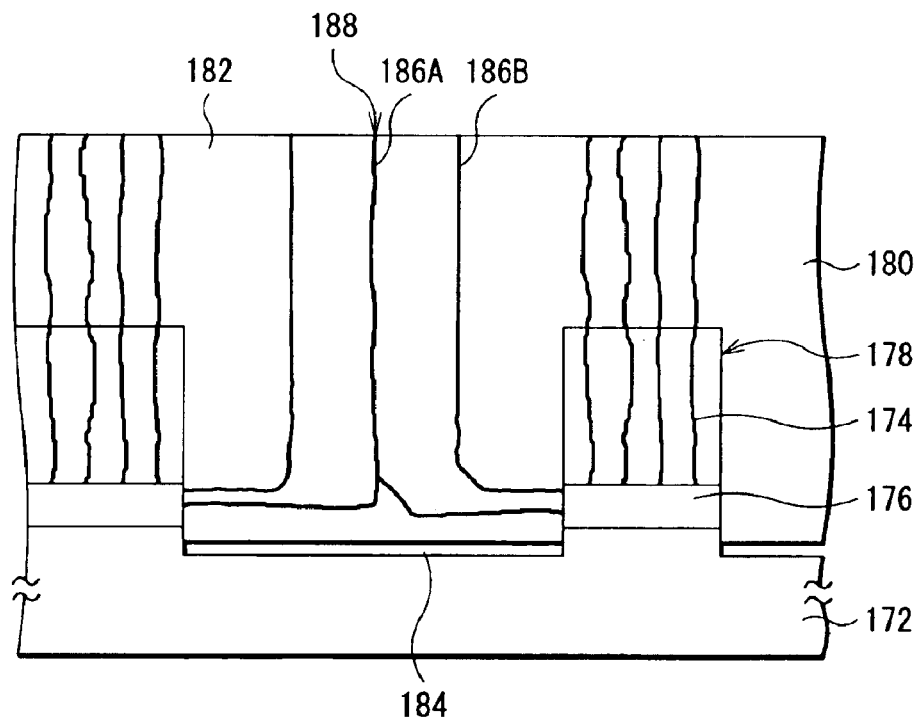
FIG. 17B is a cross sectional view explaining the shortcomings of the FS-ELO technique.
Figure 18:
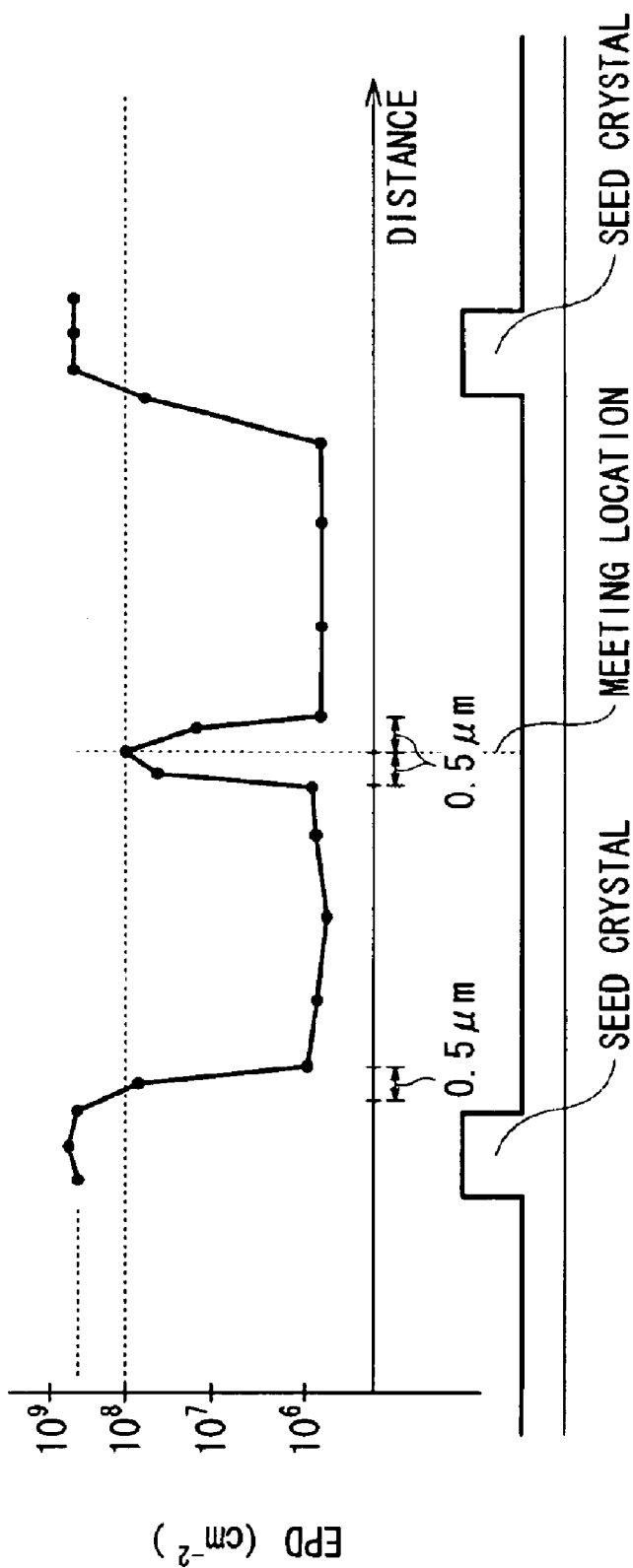
FIG. 18 is a graphic diagram showing defect densities (EPD; Etch Pit Density) of a substrate.

The present embodiment is related to an example of a multi-beam semiconductor laser device in accordance with the fifth invention. FIG. 15 is a cross section view showing the location of the seed crystal area and the meeting location in relation to the location of a laser oscillating region as well as the configuration of the laser oscillating region in accordance with the present embodiment. In FIG. 15, like references indicate similar elements as illustrated in FIG. 12, and therefore redundant explanation is not repeated.

The laser oscillating regions 160A, 160B and 160C of the multi-beam semiconductor laser device in accordance with the present embodiment are located on every other low density defective region respectively as illustrated in FIG. 15.

Namely, the laser oscillating regions 160A to 160C are located respectively on the low density defective region between the GaN seed crystal member 114A and the meeting location 130A, on the low density defective region between the GaN seed crystal member 114B and the meeting location 130B, and on the low density defective region between the GaN seed crystal member 114C and the meeting location 130C.

On the other hand, there is provided no laser oscillating region on the low density defective region between the meeting location 130A and the GaN seed crystal member 114B, on the low density defective region between the meeting location 130B and the GaN seed crystal member 114C and on the low density defective region between the meeting location 130C and the GaN seed crystal member 114D.

The GaN seed crystal members 114A to 114C, as well as the meeting locations 180A to 130C, are periodically formed on the sapphire substrate 112.

The laser oscillating regions 160A to 160C have the same width W, for example, 1.6 µm.

In the case where the distance between the GaN seed crystal member 114A and the laser oscillating region 160A is $X_1$, where the distance between the laser oscillating region 160A and the meeting location 130A is $X_2$, where the distance between the GaN seed crystal member 114B and the laser oscillating region 160B is $X_3$, where the distance between the laser oscillating region 160B the meeting location 130B is $X_4$, where the distance between the laser oscillating region 160C and the meeting location 114C is $X_5$ and where the distance between the laser oscillating region 160C and the meeting location 130C is $X_6$, then $X_1$, $X_2$, $X_3$, $X_4$, $X_5$ and $X_6$ are no smaller than 0.5 µm respectively, for example, 2 µm, 2 µm, 2 µm, 2 µm, 2 µm and 2 µm, As explained in the above, in accordance with the present embodiment, since the laser oscillating regions 160A to 160C are formed on the low density defective regions, it is possible to obtain good laser characteristics and a long device life cycle.

Also, it is possible to realize a semiconductor laser device capable of emitting beams at a high output power level by implementing a plurality of the laser oscillating regions 160A to 160C in accordance with the present embodiment in a multi-beam semiconductor laser device.

Although only one laser oscillating region is located on one low density defective region between the GaN seed crystal member 114 and the meeting location 130 in accordance with the embodiment of the second invention, the embodiment of the third invention and the embodiment of the fifth invention, it is possible to arrange in one low density defective region a plurality of the laser oscillating region.

First Embodiment of the Sixth Invention

Figure 19:
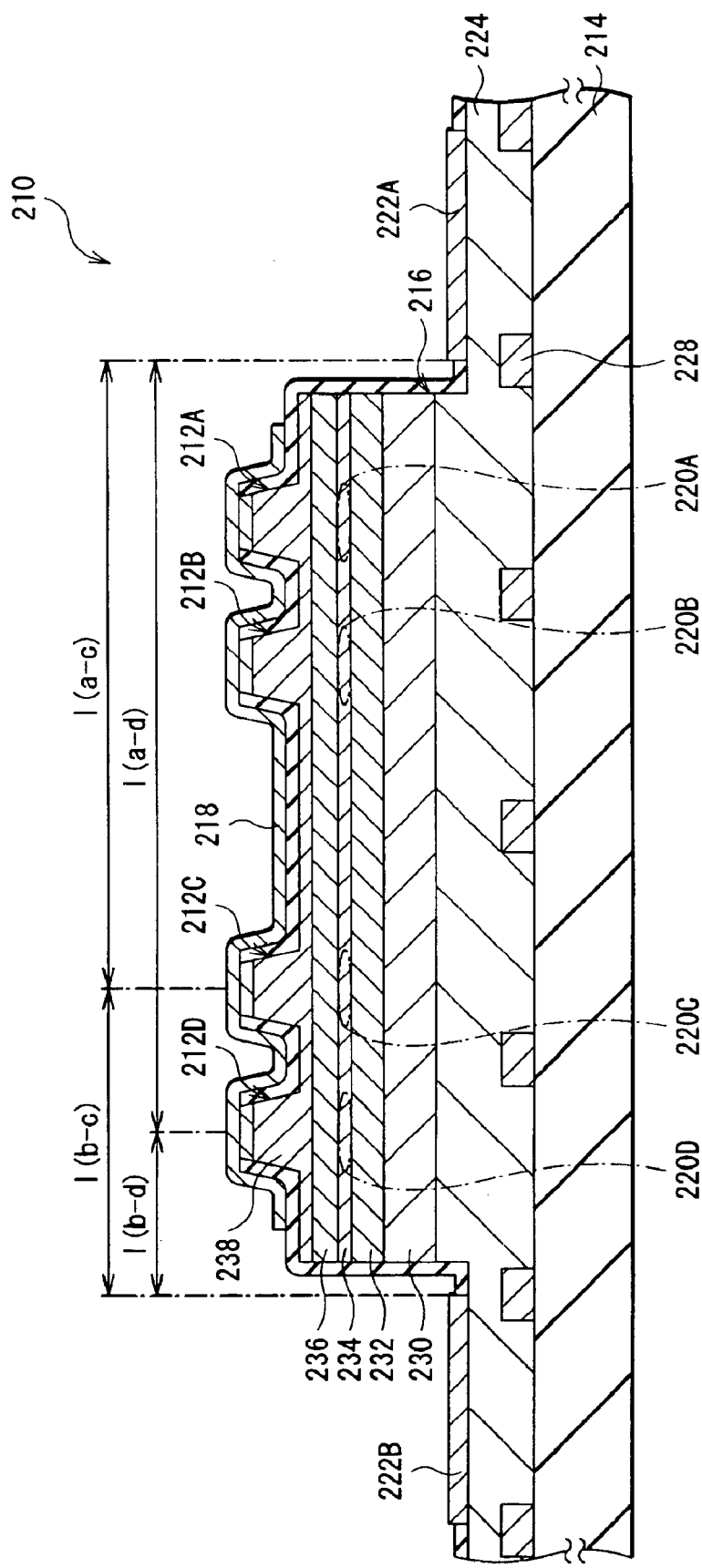
FIG. 19 is a cross sectional view showing the configuration of a GaN base multi-beam semiconductor laser device in accordance with a first embodiment of a sixth invention.

The present embodiment is related to an example of a multi-beam semiconductor laser device in accordance with the sixth invention. FIG. 19 is a cross section view showing the configuration of a GaN base multi-beam semiconductor laser device.

The multi-beam semiconductor laser device 210 in accordance with the present embodiment is a GaN base multi-beam semiconductor laser device provided with four laser oscillating regions 212A, 212B, 212C and 212D as illustrated in FIG. 19 which are capable of emitting laser beams with the same wavelength.

The laser oscillating regions 212A to 212D are fabricated on a common mesa structure 216, which is formed on a sapphire substrate 214, and provided with the active region 220A, 220B, 220C and 220D respectively. A p-type common electrode 218 is formed on the respective laser oscillating regions 212A to 212D and includes stripe electrodes of the respective laser oscillating regions 212A to 212D while the active regions 220A, 220B, 220C and 220D are located under the p-type common electrode 218. In this case, each stripe electrode is a portion of the p-type common electrode 218 corresponding to one of the respective laser oscillating regions 212A to 212D. Meanwhile, the area of the stripe electrode corresponding to each of the respective laser oscillating regions 212A to 212D is restricted by an $SiO_2$ film 226 as will be explained infra with reference to FIG. 20.

Also, two n-type electrodes 222A and 222B are provided on an n-type GaN contact layer 224 and located as common electrodes opposite to the p-type common electrode 218 on both sides of the mesa structure 216.

The distance l(a–c) between the center of the laser oscillating region 212C and the edge of the n-type electrode 222A just adjacent to the laser oscillating region is 250 µm while the distance l(b–c) between the center of the laser oscillating region 212C and the edge of the n-type electrode 222B just adjacent to the laser oscillating region is 70 µm.

Also, the distance l(b–d) between the center of the laser oscillating region 212D and the edge of the n-type electrode 222B just adjacent to the laser oscillating region is 60 µm while the distance l(a–d) between the center of the laser oscillating region 212D and the edge of the n-type electrode 222A just adjacent to the laser oscillating region is 260 µm.

The relationships of the laser oscillating regions 212A and 212B and the n-type electrodes 222A and 222B in regard to the respective distances therebetween are the same as the relationships of the laser oscillating regions 212C and 212D and the n-type electrodes 222A and 222B in regard to the respective distances therebetween.

In accordance with the present embodiment, the interval between the laser oscillating region 212B and the laser oscillating region 212C is larger than the interval between the laser oscillating region 212A and the laser oscillating region 212B and larger than the laser oscillating region 212C and the laser oscillating region 212D. This is only for the purpose of facilitating the test procedure of the multi-beam semiconductor laser device 210 while it is not requisite to make relatively wider the interval between the laser oscillating region 212B and the laser oscillating region 212C but it is possible to make the interval equal to the interval between the other laser oscillating regions.

Figure 20:
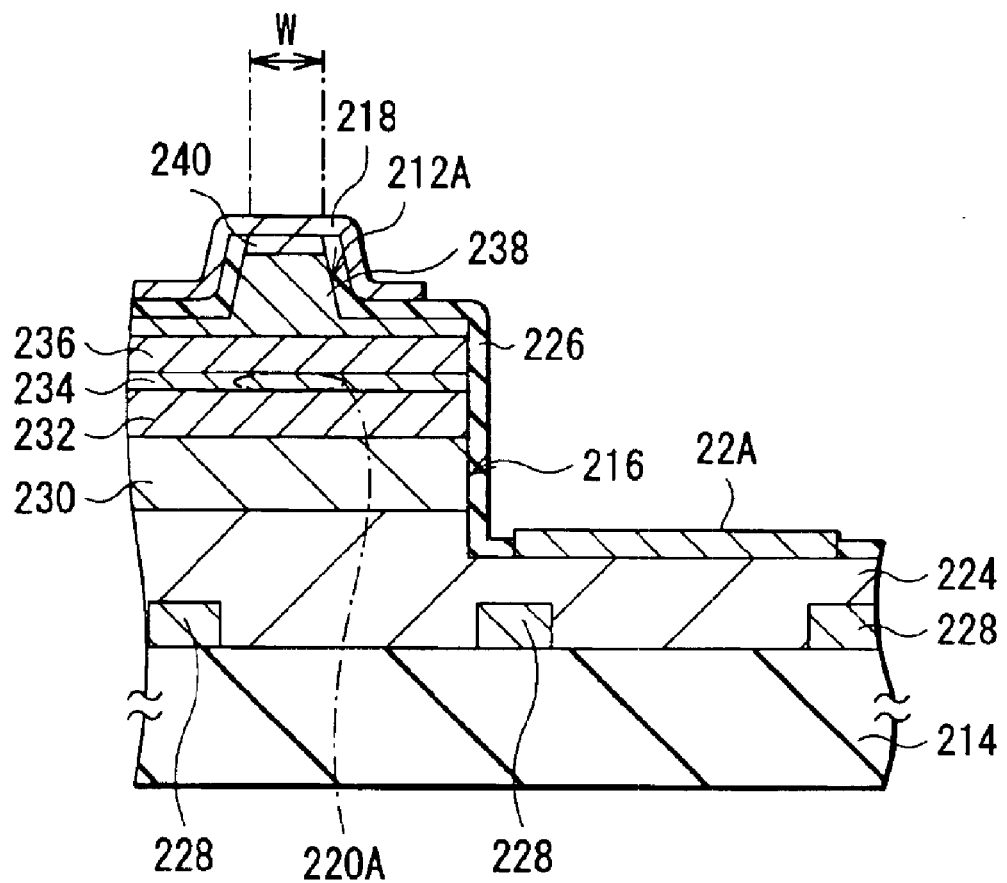
FIG. 20 is a cross section view showing the configuration of each laser oscillating region as illustrated in FIG. 19.

Each of the laser oscillating regions 212A to 212D is an air-ridge type laser oscillating region in which current is confined by an SiO$_2$ film 226 as illustrated in FIG. 20, like the multi-beam semiconductor laser device 40 in accordance with the first embodiment of the first invention.

A GaN seed crystal layer 228, an n-type GaN contact layer 224, an n-type AlGaN cladding layer 230, an n-type GaN light guide layer 232, an active layer 234, a p-type GaN light guide layer 236, a p-type AlGaN cladding layer 238 and a p-type GaN contact layer 240 are sequentially laminated on the C-plane of the sapphire substrate 214 in a laminate structure. Meanwhile, not shown in the figure, a GaN buffer layer may be grown at a low temperature between the sapphire substrate 214 and the GaN seed crystal layer 228.

The upper portion of the p-type AlGaN cladding layer 238 and the p-type GaN contact layer 240 are functioning as the laser oscillating region 212A and extending in the form of a ridge stripe in one direction.

Also, the upper portion of the n-type GaN contact layer 224 and the n-type AlGaN cladding layer 230, the n-type GaN light guide layer 232, the active layer 234, the p-type GaN light guide layer 236 and the lower portion of the p-type AlGaN cladding layer 238 are formed as the mesa structure 216 extending in the same direction as the laser oscillating region 212A is extending.

Meanwhile, the mesa structure 216 is formed as a common mesa structure of the laser oscillating region 212A to 212D. In other words, the n-type GaN contact layer 224, the n-type AlGaN cladding layer 230, the n-type GaN light guide layer 232, the active layer 234, the p-type GaN light guide layer 236 and the p-type AlGaN cladding layer 238 are formed as a common laminate structure to the respective laser oscillating region 212A to 212D.

Furthermore, the GaN seed crystal layer 228 is formed as a concavo-convex structure extending in the same direction as the laser oscillating region 212A and the mesa structure 216 are extending while the laser oscillating region 212A is located between two concave portions of the concavo-convex structure.

The laser oscillating region 212A to 212D, the mesa structure 216 and the n-type GaN contact layer 224 adjacent to the mesa structure 216 are coated with the SiO$_2$ film 226 except for the upper surface of the laser oscillating region 212A to 212D and the openings provided part of the n-type GaN contact layer 224.

The p-type common electrode 218 made of a multi-layered metallic film such as a Pd/Pt/Au electrode is formed over the respective p-type GaN contact layer 240, as a common ohmic junction electrode to the respective laser oscillating region 212A to 212D through openings of the SiO$_2$ film 226.

Also, n-type electrodes 222A and 222B made of a multi-layered metallic film such as Ti/Al/Pt/Au electrodes are formed on the n-type GaN contact layer 224 on both sides of the mesa structure 216, as common ohmic junction electrodes to the respective laser oscillating region 212A to 212D through openings of the SiO$_2$ film 226.

However, because of the respective distances between the laser oscillating regions 212A to 212D and the n-type electrodes 222A and 222B, the n-type electrode 222A mainly serves as the common electrode to the laser oscillating regions 212A and 212B while the n-type electrode 222B mainly serves as the common electrode to the laser oscillating regions 212C and 212D.

In the case of the multi-beam semiconductor laser device 210 in accordance with the present embodiment as operated at 30 mW or thereabout, $\rho v \cdot d/L$ is 30 $\Omega\mu$m and rsh/L is 150 $\Omega\mu$m. However, $\rho v$ is the effective specific resistance in the longitudinal direction from the p-type common electrode 218 through the active layer 234; d is the effective thickness in the longitudinal direction from the p-type common electrode 218 to the active layer 234 through the active layer 234, i.e., the thickness of the mesa structure 216; rsh is the sheet resistance from the p-type common electrode 218 to the n-type electrodes 222A and 222B; and L is the resonator length.

The outer laser oscillating region 212D is the first oscillating area (1) from the common n-type electrode 222B while the inner laser oscillating region 212C is the second laser oscillating region (2) from the common n-type electrode 222B.

Uniform current injection becomes possible in accordance with the above described equation 2 if the area S(1) of the stripe electrode of the laser oscillating region (1) and the area S(2) of the stripe electrode of the laser oscillating region (2) satisfy $$(\rho v \cdot d)/(S(1))+A_1=(\rho v \cdot d)/(S(2))+A_2$$

$$A_1=rsh \cdot (lN(1) \cdot 1F(1))/(lN(1)+1F(1)) \cdot 1/L$$

$$A_2=rsh \cdot (lN(2) \cdot 1F(2))/(lN(2)+1F(2)) \cdot 1/L$$

where lN(1) is the distance in the lateral direction between the laser oscillating region (1) and the common electrode near to the laser oscillating region (1), i.e., the n-type electrode 222B; 1F(1) is the distance in the lateral direction between the laser oscillating region (1) and the common electrode remote from the laser oscillating region (1), i.e., the n-type electrode 222A, lN(2) is the distance in the lateral direction between the laser oscillating region (2) and the common electrode near to the laser oscillating region (2), i.e., the n-type electrode 222B, 1F(2) is the distance in the lateral direction between the laser oscillating region (2) and the common electrode remote from the laser oscillating region (2), i.e., the n-type electrode 222A, and L is the resonator length.

As described above, $$lN(1)=1(b-d)=50 \ \mu\text{m}$$

$$lF(1)=1(a-d)=270 \ \mu\text{m}$$

$$lN(2)=1(b-c)=60 \ \mu\text{m}$$

$$lF(2)=1(a-c)=260 \ \mu\text{m}.$$

Figure 21:
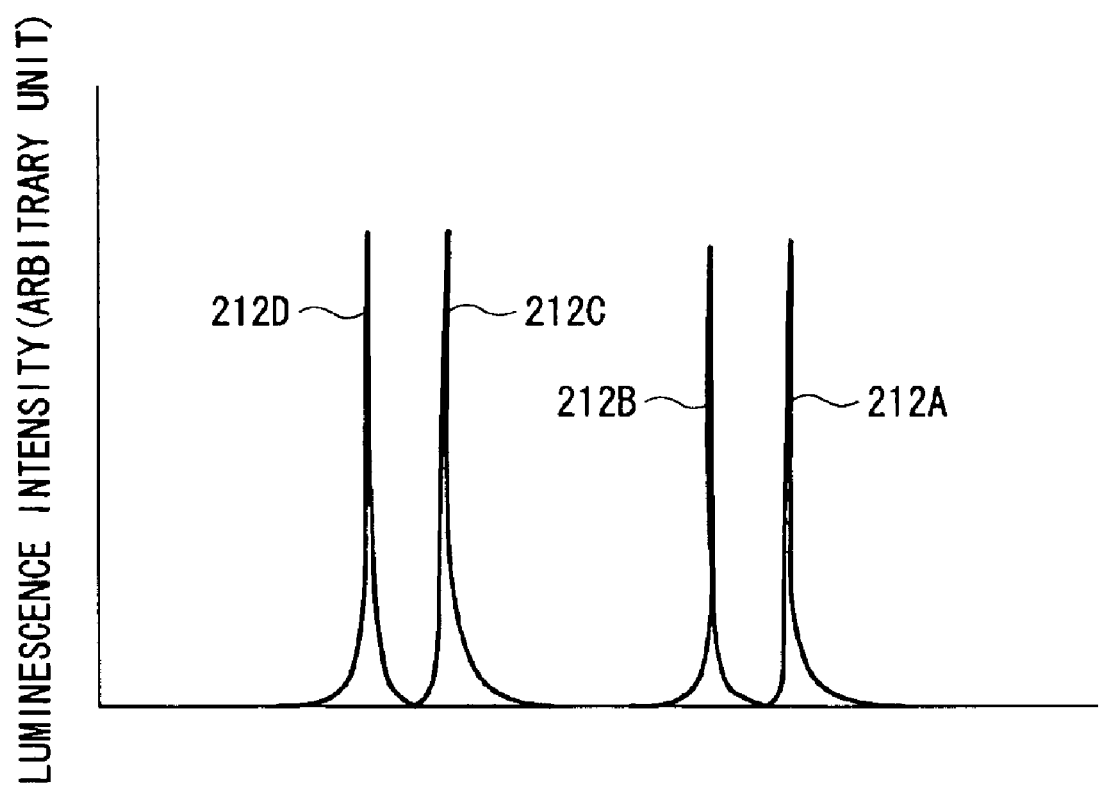
FIG. 21 is a graphic diagram showing the luminescence intensities of the respective location of the laser oscillating regions of the multi-beam semiconductor laser device as illustrated in FIG. 19.

Also, in the case where the respective widths of the laser oscillating region (1) and the laser oscillating region (2), more exactly speaking, the widths of the stripe electrodes (the width W as illustrated in FIG. 20) are W(1) and W(2), then $$S(1)=W(1) \cdot L$$

$$S(2)=W(2) \cdot L$$

and therefore, when W(1) is set to be 1.5 $\mu$m in designing the p-type common electrode 218, it is possible by setting W(2) to be 1.53 $\mu$m to make uniform the luminescence intensities of the respective laser oscillating regions 212A to 212D as illustrated in FIG. 21. Meanwhile, the widths of the laser oscillating regions 212A and 212B are the same as the widths of the laser oscillating regions 212C and 212D respectively.

Second Embodiment of the Sixth Invention

Figure 22:
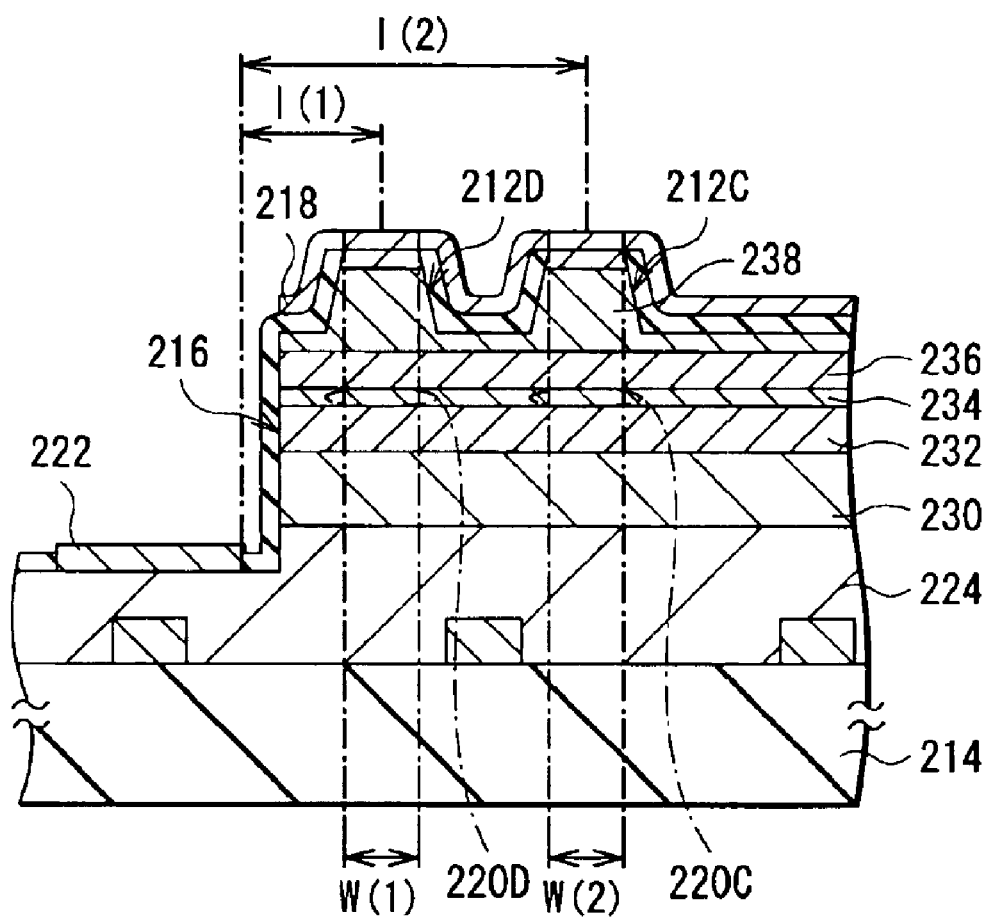
FIG. 22 is a cross sectional view showing the configuration of a GaN base multi-beam semiconductor laser device in accordance with a second embodiment of the sixth invention.

The present embodiment is related to another example of a multi-beam semiconductor laser device in accordance with the sixth invention. FIG. 22 is a schematic cross section view showing the configuration of the multi-beam semiconductor laser device. In FIG. 22, like references indicate similar elements as illustrated in FIG. 19 and FIG. 20, and therefore redundant explanation is not repeated.

The multi-beam semiconductor laser device in accordance with the present embodiment is provided with two laser oscillating region 212C and 212D on the common mesa structure 216 as illustrated in FIG. 22 and has the same configuration as the multi-beam semiconductor laser device 210 in accordance with the first embodiment of the sixth invention except that one common n-type electrode 222 is located aside of the laser oscillating region 212D.

Namely, the distance l(1) between the edge of the n-type electrode 222 just adjacent to the laser oscillating region and the center of the laser oscillating region 212D (the first oscillating area (1) from the common n-type electrode 222) is 60 μm while the distance l(2) between the edge of the n-type electrode 222 just adjacent to the laser oscillating region and the center of the laser oscillating region 212C (the first oscillating area (2) from the common n-type electrode 222) is 70 μm.

In the case where the multi-beam semiconductor laser device is operated at 30 mW or thereabout, ρv·d/L is 30 Ωμm and rsh/L is 150 Ωμm. It is possible to uniformly inject electric current in accordance with the above described equation 1 if satisfying $(\rho v \cdot d)/(W1 \cdot L)+B_1=(\rho v \cdot d)/(W2 \cdot L)+B_2$ $B_1=rsh \cdot l(1) \cdot 1/L$ $B_2=rsh \cdot l(2) \cdot 1/L$ where W1 and W2 are the respective widths of the laser oscillating region (1) and the laser oscillating region (2), more exactly speaking, the widths of the stripe electrodes.

Accordingly, if W1 is set to be 1.5 μm when designing the p-type electrode, it is possible by setting W2 to be 1.55 μm to make uniform the luminescence intensities of the respective laser oscillating regions 212C and 212D.

Third Embodiment of the Sixth Invention

Figure 23:
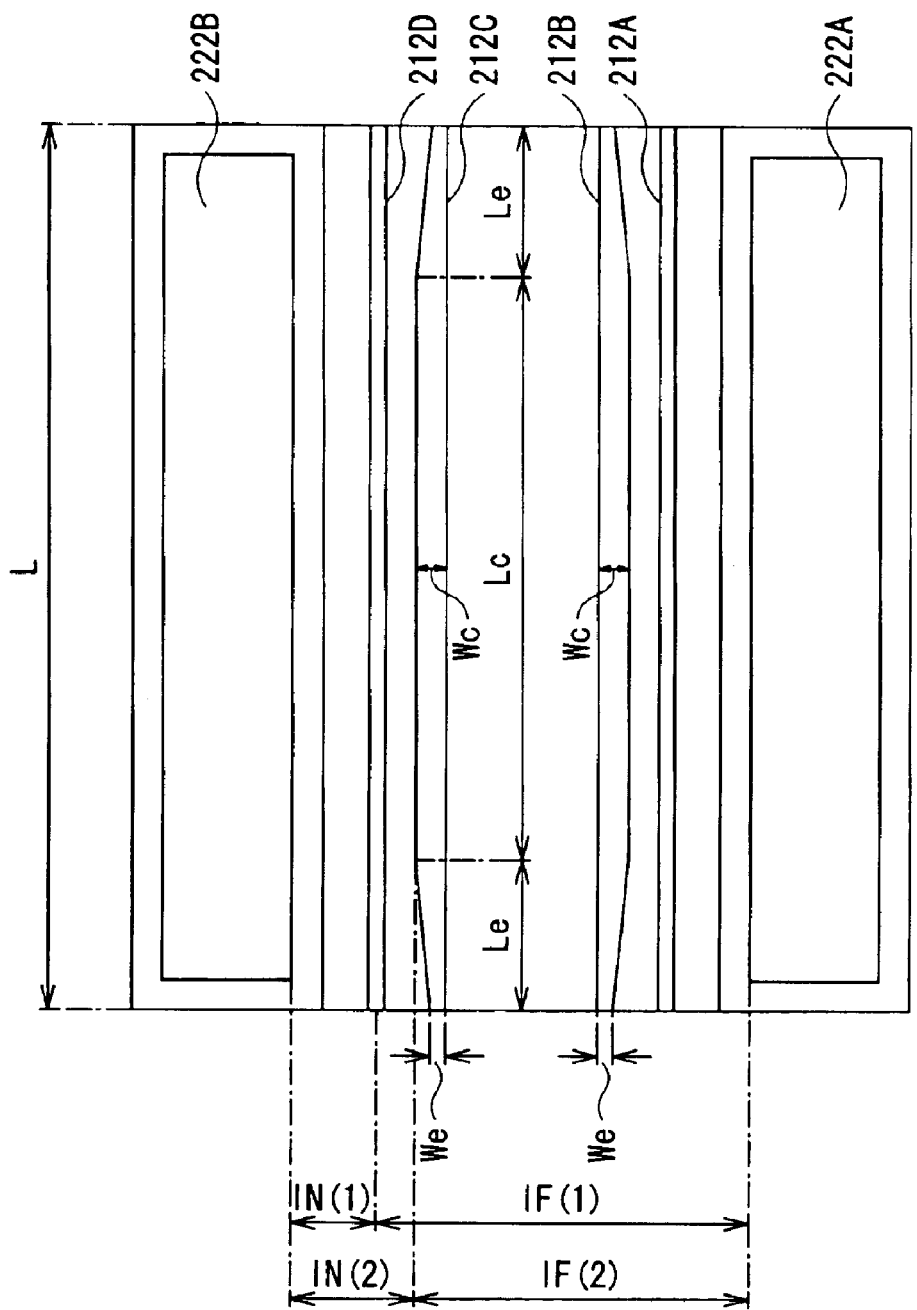
FIG. 23 is a plan view showing the configuration of the multi-beam semiconductor laser device in accordance with a third embodiment of the sixth invention.
Figure 24:
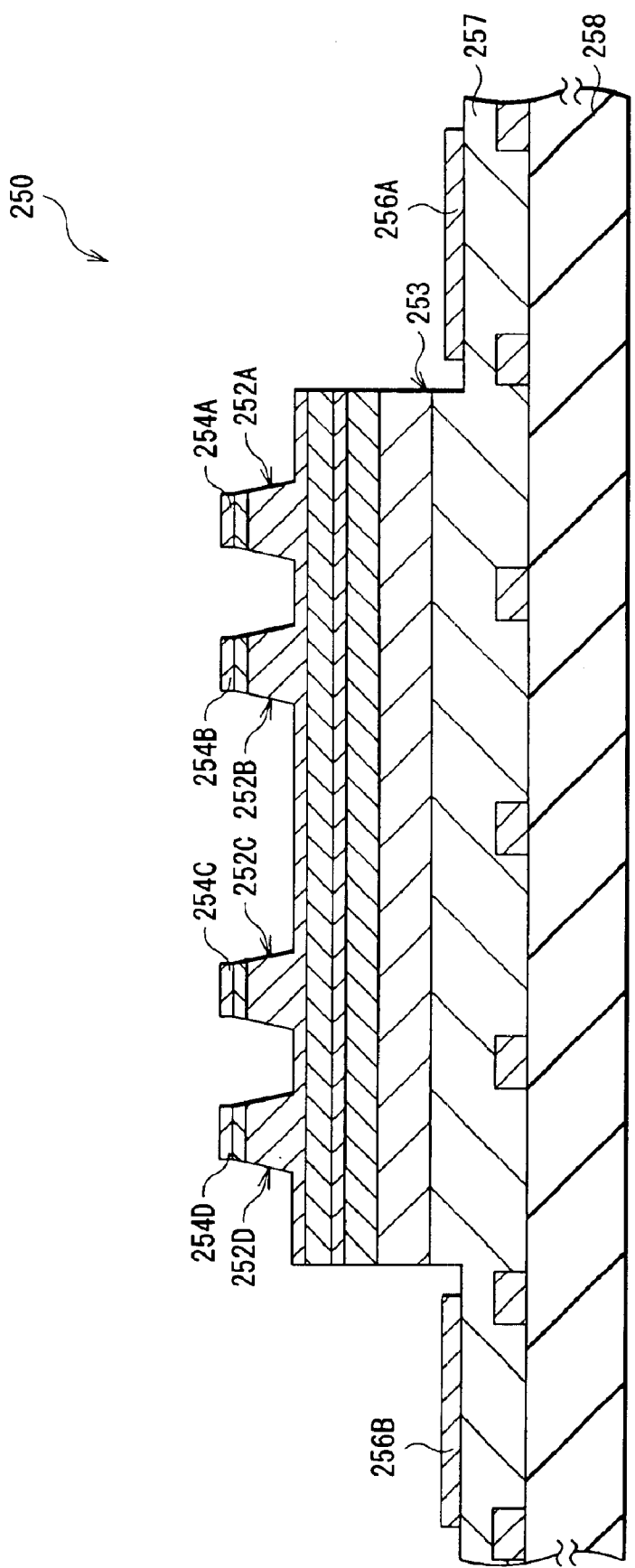
FIG. 24 is a cross sectional view showing the configuration of a multi-beam semiconductor laser for explaining the problems of the multi-beam semiconductor laser device.
Figure 25:
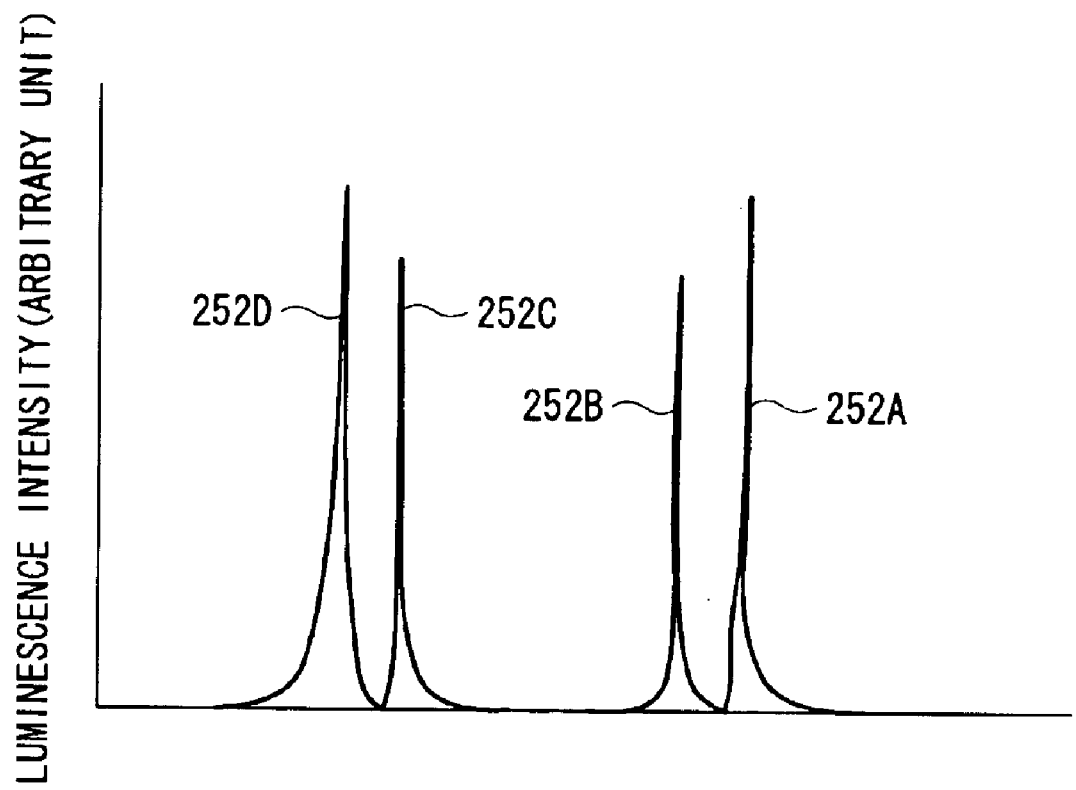
FIG. 25 is a graphic diagram showing the luminescence intensities of the respective location of the laser oscillating regions of the multi-beam semiconductor laser device as illustrated in FIG. 24.

The present embodiment is related to a further example of a multi-beam semiconductor laser device in accordance with the sixth invention. FIG. 23 is a plan view showing the configuration of the multi-beam semiconductor laser device in accordance with the present embodiment. In FIG. 23, like references indicate similar elements as illustrated in FIG. 19 and FIG. 20, and therefore redundant explanation is not repeated.

The multi-beam semiconductor laser device in accordance with the present embodiment has the same configuration as the multi-beam semiconductor laser device 210 in accordance with the first embodiment of the sixth invention except that the laser oscillating regions 212B and 212C are tapered laser oscillating regions.

In the case of the present embodiment, as illustrated in FIG. 23, while the resonator length L is 600 μm, the laser oscillating regions 212B and 212C includes center portions whose stripe width Wc is constant at 1.66 μM and side portions which are extending from the center portions and become narrower toward the light emitting end surfaces where the stripe width We is 1.5 μm. The laser oscillating regions 212B and 212C are tapered by making broken lines the edges of the side portions near the laser oscillating region 212A and the laser oscillating region 212D.

The lengths Lc of the center portions are 400 μm while the lengths Le of the side portions as tapered are 100 μm.

The distance lN(1) between the center of the laser oscillating region 212D (the laser oscillating region (1)) and the edge of the n-type electrode 222B just adjacent to the laser oscillating region is 60 μm while the distance lF(1) between the center of the laser oscillating region 212D and the edge of the n-type electrode 222A just adjacent to the laser oscillating region is 260 μm.

Also, the distance lN(2) between the center of the laser oscillating region 212C (the laser oscillating region (2)) and the edge of the n-type electrode 222B just adjacent to the laser oscillating region is 70 μM while the distance lF(2) between the center of the laser oscillating region 212C and the edge of the n-type electrode 222A just adjacent to the laser oscillating region is 250 μm.

In the case where the multi-beam semiconductor laser device is operated at 30 mW or thereabout, ρv·d/L is 30 Ωμm and rsh/L is 150 Ωμm. Uniform current injection becomes possible in accordance with the above described equation 2 if satisfying $(\rho v \cdot d)/S(1)+A_1=(\rho v \cdot d)/S(2)+A_2$ $A_1=rsh \cdot (lN(1) \cdot 1F(1))/(lN(1)+1F(1)) \cdot 1/L$ $A_2=rsh \cdot (lN(2) \cdot 1F(2))/(lN(2)+1F(2)) \cdot 1/L$ where S(1) and S(2) are the area of the laser oscillating region 212D near to the n-type electrode 222B and the area of the laser oscillating region 212C remote from the n-type electrode 222B.

Accordingly, if S(1) is set to be 900 μm² when designing the p-type electrode, it is possible by setting S(2) to be 916 μm² to make uniform the luminescence intensities of the respective laser oscillating regions 212A to 212D. Meanwhile, the stripe areas of the laser oscillating regions 212A and 212B are the same as the areas of the laser oscillating regions 212C and 212D respectively.

The multi-beam semiconductor laser device in accordance with the first invention has a common substrate provided with a mesa structure on which a plurality of laser oscillating regions are fabricated in the form of stripes, and comprises: a first electrode provided for each of the plurality of laser oscillating regions for functioning as one of a p-type electrode and an n-type electrode of each laser oscillating region; and a second electrode located aside of the mesa structure on the common substrate as a common electrode to at least two of the plurality of the laser oscillating regions for functioning as the other of the p-type electrode and the n-type electrode of each of the two laser oscillating regions and as an opposite electrode to the first electrode, and therefore it is easy to adjust the alignment of electrodes when mounting on a sub mount, and particularly the invention is suitably applied to GaN base devices.

Also, the equations of $A \leq 100$ μm and $B \leq 150$ μm are satisfied where A is a distance between one of the laser oscillating regions closest to an edge of the common electrode aside of the laser oscillating regions and another of the laser oscillating regions farthest from the edge of the common electrode; and B is a distance between another of the oscillating regions farthest from the edge of the common electrode and the edge of the common electrode aside of the laser oscillating regions, and therefore it is possible to increase and make equal the optical output levels of the respective laser oscillating regions.

Furthermore, in the case of the multi-beam semiconductor laser devices in accordance with the second to fifth inventions, the equations of $X_1 \geq 0.5$ μm and $X_2 \geq 0.5$ μm are satisfied where $X_1$ is a distance between each of the laser oscillating regions and one of the seed crystal areas, and $X_2$ is a distance between each of the laser oscillating regions and one of the meeting locations, and therefore it is possible to arrange a plurality of laser oscillating regions in low density defective regions. By this configuration, a high reliability semiconductor laser device having good laser characteristics, a high optical output level and a long device life cycle can be realized.

Furthermore, the multi-beam semiconductor laser device in accordance with the sixth invention comprises a first electrode comprising stripe electrodes provided for each of a plurality of laser oscillating regions for functioning as one of a p-type electrode and an n-type electrode of the laser oscillating region; and a second electrode located aside of the mesa structure on the common substrate as a common electrode to at least two of the plurality of the laser oscillating regions for functioning as the other of the p-type electrode and the n-type electrode of each of the two laser oscillating regions and as an opposite electrode to the first electrode, wherein the plurality of the stripe electrodes of the first electrode have different areas corresponding to the distances thereof from the common electrode in order to flow a substantially same current from the stripe electrodes of the first electrode, and therefore it is possible to make uniform the luminescence intensities of the respective laser oscillating regions. Accordingly, it is possible to make uniform the degradation of the active regions of the respective laser oscillating regions and to significantly improve the device life cycle as compared with that of a multi-beam semiconductor laser device emitting laser beams at dispersed luminescence intensities. Also, since there is no dispersion in the luminescence intensities of the respective laser oscillating regions, it is possible to expand the range of applications of the multi-beam semiconductor laser.

It is obvious that various implementations and modifications of the present invention are possible with reference to the explanation as described above. Accordingly, it is possible to implement the present invention in other embodiments than those explained in the above detailed description within the scope as equivalently recited in the following claims.

What is claimed is:

1. A multi-beam semiconductor laser device comprising:
a common substrate within which are formed high density defective regions originating from seed crystal areas and meeting locations and low density defective regions each of which is located between adjacent ones of the seed crystal areas and the meeting locations, the high density defective regions and the low density defective regions being periodically and alternately arranged in parallel with each other in the form of stripes; and
a plurality of laser oscillating regions formed on the common substrate and capable of emitting laser beams respectively,
wherein,
each of the laser oscillating regions is located in a different one of the low density defective regions, $X_1 \geq 0.5$ μm, and $X_2 \geq 0.5$ μm, where $X_1$ is a distance between the each of the laser oscillating regions and one of the seed crystal areas, and
$X_2$ is a distance between the each of the laser oscillating regions and one of the meeting locations.

2. A multi-beam semiconductor laser device comprising:
a common substrate within which are formed high density defective regions originating from seed crystal areas and meeting locations and low density defective regions each of which is located between adjacent ones of the seed crystal areas and the meeting locations, the high density defective regions and the low density defective regions being periodically and alternately arranged in parallel with each other in the form of stripes; and
a plurality of laser oscillating regions formed on the common substrate and capable of emitting laser beams respectively,
wherein,
the laser oscillating regions are located in the low density defective regions which are arranged adjacent to each other with the seed crystal areas and the meeting locations in between, $X_1 \geq 0.5$ μm, and $X_2 \geq 0.5$ μm, where $X_1$ is a distance between one of the laser oscillating regions and one of the seed crystal areas, and
$X_2$ is a distance between one of the laser oscillating regions and one of the meeting locations.

3. A multi-beam semiconductor laser device comprising:
a common substrate within which are formed high density defective regions originating from seed crystal areas and meeting locations and low density defective regions each of which is located between adjacent ones of the seed crystal areas and the meeting locations, the high density defective regions and the low density defective regions being periodically and alternately arranged in parallel with each other in the form of stripes; and
a plurality of laser oscillating regions formed on the common substrate and capable of emitting laser beams respectively,
wherein,
at least two of the laser oscillating regions are located in each of the low density defective regions, $X_1 \geq 0.5$ μm, and $X_2 \geq 0.5$ μm, where $X_1$ is a distance between one of the laser oscillating regions and one of the seed crystal areas, and
$X_2$ is a distance between one of the laser oscillating regions and one of the meeting locations.

4. A multi-beam semiconductor laser device comprising:
a common substrate within which are formed high density defective regions originating from seed crystal areas and meeting locations and low density defective regions each of which is located between adjacent ones of the seed crystal areas and the meeting locations, the high density defective regions and the low density defective regions being periodically and alternately arranged in parallel with each other in the form of stripes; and a plurality of laser oscillating regions formed on the common substrate and capable of emitting laser beams respectively, wherein, the laser oscillating regions are located on every other region of the low density defective regions, $X_1 \geq 0.5$ μm, and $X_2 \geq 0.5$ μm, where $X_1$ is a distance between one of the laser oscillating regions and one of the seed crystal areas, and $X_2$ is a distance between one of the laser oscillating regions and one of the meeting locations.

5. A multi-beam semiconductor laser device having a common substrate provided with a mesa structure on which a plurality of laser oscillating regions are fabricated in the form of stripes, the multi-beam semiconductor laser device comprising:

a first electrode comprising stripe electrodes provided for each of the plurality of laser oscillating regions for functioning as one of a p-type electrode and an n-type electrode of the each laser oscillating region; and a second electrode located aside of the mesa structure on the common substrate as a common electrode to at least two of the plurality of the laser oscillating regions for functioning as the other of the p-type electrode and the n-type electrode of each of the two laser oscillating regions and as an opposite electrode to the first electrode, wherein, the plurality of the first electrode have different areas corresponding to the distances thereof from the common electrode in order to flow a substantially same current from the first electrode.

6. The multi-beam semiconductor laser device as set forth in claim 5, wherein:

n laser oscillating regions are provided with a first electrode in the form of stripe electrodes respectively and joined to a common electrode (second electrode) located aside of a mesa structure; and $(\rho v \cdot d)/S(i) + rsh \cdot (1(i)/L) = C$ (constant value)

where ρv is an effective specific resistance in the longitudinal direction from the first electrode through the laser oscillating region; d is an effective thickness in the longitudinal direction from the first electrode to the common electrode through the laser oscillating regions;

rsh is a sheet resistance from the first electrode to the common electrode; L is a resonator length of the laser oscillating regions;

S(i) is the area of the first electrode of i-th (i=1, 2, . . . n) laser oscillating region (i) of the laser oscillating regions; 1(i) is a distance in the lateral direction from the center of the laser oscillating region (i) to the common electrode.

7. A multi-beam semiconductor laser device as set forth in claim 5, wherein:

n laser oscillating regions are provided with the first electrode in the form of stripe electrodes respectively and joined to first and second common electrodes located on both sides of a mesa structure;

$(\rho v \cdot d)/S(i) + rsh \cdot A(i) \cdot (1/L) = C$ (constant value), and $A(i) = (1N(i) \cdot 1F(i))/(1N(i)+1F(i))_2$ where ρv is an effective specific resistance in the longitudinal direction from the first electrode through the laser oscillating region;

d is an effective thickness in the longitudinal direction from the first electrode to the first and equivalently second common electrode through the laser oscillating regions;

rsh is a sheet resistance from the first electrode to the first and equivalently second common electrode;

L is a resonator length of the laser oscillating regions;

S(i) is the area of the first electrode of i-th (i =1,2, n) laser oscillating region (i) of the laser oscillating regions;

IN(i) is a distance in the lateral direction from the center of the laser oscillating region (i) to one of the common electrode near to the center of the laser oscillating region (1); and 1F(i) is a distance in the lateral direction from the center of the laser oscillating region (i) to one of the common electrode remote from the center of the laser oscillating region (1).

8. A multi-beam semiconductor laser device as set forth in ay one of claims 5 through 7, wherein at least one edge of at least one of the plurality of laser oscillating regions is tapered in a plan view.

* * * * *